US010109518B1

(12) United States Patent
Min et al.

(10) Patent No.: US 10,109,518 B1
(45) Date of Patent: Oct. 23, 2018

(54) PICKUP UNIT AND PICKUP SYSTEM OF SEMICONDUCTOR DEVICE INCLUDING THE SAME

(71) Applicant: SAMSUNG ELECTRONICS CO., LTD., Suwon-si, Gyeonggi-do (KR)

(72) Inventors: Hyun-Jin Min, Seongnam-si (KR); Jung-Hoon Baek, Suwon-si (KR); Won-Guk Seo, Gunpo-si (KR); Sung-Bong Kim, Cheonan-si (KR); Suk-Won Lee, Yongin-si (KR)

(73) Assignees: SAMSUNG ELECTRONICS CO., LTD., Suwon-si, Gyeonggi-do (KR); SEMES CO., LTD., Cheonan-si, Chengcheongnam-do (KR)

( * ) Notice: Subject to any disclaimer, the term of this patent is extended or adjusted under 35 U.S.C. 154(b) by 0 days.

(21) Appl. No.: 15/798,686

(22) Filed: Oct. 31, 2017

(30) Foreign Application Priority Data

Mar. 28, 2017 (KR) ........................ 10-2017-0039078

(51) Int. Cl.
*H01L 21/683* (2006.01)
*B25J 15/02* (2006.01)

(52) U.S. Cl.
CPC ...... *H01L 21/6838* (2013.01); *B25J 15/0226* (2013.01)

(58) Field of Classification Search
CPC ............... H01L 21/6838; B25J 15/0616; B25J 15/0226; B65G 47/91; B65G 47/918; B65G 47/917
See application file for complete search history.

(56) References Cited

U.S. PATENT DOCUMENTS

| | | | | |
|---|---|---|---|---|
| 6,145,901 A | * | 11/2000 | Rich ...................... | B25J 15/026 414/752.1 |
| 6,217,093 B1 | * | 4/2001 | Neutel ................... | B65G 47/28 414/751.1 |
| 6,346,682 B2 | * | 2/2002 | Kim ...................... | B65G 47/911 414/153 |
| 7,464,807 B2 | * | 12/2008 | Ham .................. | G01R 31/2893 414/749.5 |
| 7,954,869 B2 | * | 6/2011 | Shim ................. | H01L 21/68707 198/468.3 |
| 8,038,191 B2 | | 10/2011 | Shim et al. | |
| 8,534,727 B2 | * | 9/2013 | Weclawski ........... | B65G 47/918 414/749.5 |
| 8,997,592 B2 | | 4/2015 | Yang et al. | |
| 2002/0153735 A1 | | 10/2002 | Kress | |
| 2015/0375400 A1 | | 12/2015 | Kim | |

FOREIGN PATENT DOCUMENTS

| | | |
|---|---|---|
| KR | 1998-033607 A | 7/1998 |
| KR | 10-2006-0036326 A | 4/2006 |
| KR | 10-0839666 B1 | 6/2008 |

* cited by examiner

*Primary Examiner* — Gerald McClain
(74) *Attorney, Agent, or Firm* — Lee & Morse P.C.

(57) ABSTRACT

A pickup apparatus includes a plurality of pickers sliding along a first direction and a space adjuster including a plurality of space adjusting plates. Each picker includes a protruding portion combined with a picker body, and each of the space adjusting plates is between a respective pair of adjacent pickers. The protruding portion of each picker contacts sidewalls of adjacent space adjusting plates. At least one of the space adjusting plates moves along a second direction crossing the first direction. A width in the first direction of each space adjusting plate varies along the second direction.

18 Claims, 22 Drawing Sheets

FIG. 8
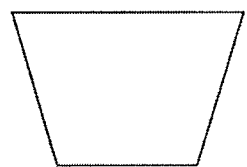
(a)
(b)
(c)

PICKUP UNIT AND PICKUP SYSTEM OF SEMICONDUCTOR DEVICE INCLUDING THE SAME

CROSS-REFERENCE TO RELATED APPLICATION

Korean Patent Application No. 10-2017-0039078, filed on Mar. 28, 2017, and entitled, "Pickup Unit and Pickup System of Semiconductor Device Including the Same," is incorporated by reference herein in its entirety.

BACKGROUND

1. Field

One or more embodiments described herein relate to a pickup unit and a pickup system of a semiconductor device including a pickup unit.

2. Description of the Related Art

A variety of semiconductor devices have been developed. One type of semiconductor device may be manufactured by packaging a semiconductor chip on a wafer. At the end of the manufacturing process, a test procedure may be performed to inspect the device. The test process may be performed using a test apparatus operated by computer programs. The purpose of the test is to, for example, inspect the electrical properties of the device and its operation under severe test conditions.

The test apparatus may include a pickup apparatus which picks up and places a semiconductor device on a tray. The pickup apparatus may include a plurality of pickup cylinders configured to vacuum suction the semiconductor device. Because shapes, sizes, volumes, and pitches of a user tray and a test tray may be different, a space adjusting device may be used to adjust distances between the cylinders. The user tray may have relatively small pitches in order to receive as many semiconductor devices as possible. In this case, the test tray may have relatively large pitches in order to secure reliability of the test apparatus.

SUMMARY

In accordance with one or more embodiments, a pickup apparatus includes a plurality of pickers to slide along a first direction, each of the plurality of pickers including a protruding portion combined with a picker body; and a space adjuster including a plurality of space adjusting plates, each of the plurality of space adjusting plates between a respective pair of adjacent pickers of the plurality of pickers, the protruding portion of each of the plurality of pickers contacting sidewalls of adjacent ones of the plurality of space adjusting plates, wherein at least one of the plurality of space adjusting plates is to move along a second direction crossing the first direction and wherein a width in the first direction of each of the plurality of space adjusting plates varying along the second direction.

In accordance with one or more other embodiments, a pickup apparatus includes a plurality of pickers to slide along a first direction, each of the plurality of pickers including a protruding portion combined with a picker body; and a space adjuster including a plurality of space adjusting plates, each of the plurality of space adjusting plates between a respective pair of adjacent pickers of the plurality of pickers, the protruding portions contacting sidewalls of adjacent ones of the plurality of space adjusting plates, wherein a width in the first direction of each of the plurality of space adjusting plates is adjusted by the protruding portions on sidewalls of respective ones of the space adjusting plates.

In accordance with one or more other embodiments, a pickup system of a semiconductor device includes a first tray including a plurality of semiconductor devices spaced apart from each other by a first distance; a second tray including a plurality of semiconductor devices spaced apart from each other by a second distance different from the first distance; and a pickup to transfer the semiconductor device to the first tray or the second tray. The pickup includes a plurality of pickers to slide along a first direction, each of the plurality of pickers including a protruding portion combined with a picker body; and a space adjuster including a plurality of space adjusting plates, each of the plurality of space adjusting plates between a respective pair of adjacent pickers of the plurality of pickers, the protruding portion of each of the plurality of pickers contacting sidewalls of adjacent ones of the plurality of space adjusting plates, wherein at least one of the plurality of space adjusting plates is to move along a second direction crossing the first direction, and wherein widths in the first direction of the plurality of space adjusting plates vary along the second direction.

BRIEF DESCRIPTION OF THE DRAWINGS

Features will become apparent to those of skill in the art by describing in detail exemplary embodiments with reference to the attached drawings in which:

FIG. 8 illustrates another embodiment of a space adjusting part.

DETAILED DESCRIPTION

Figure 1:
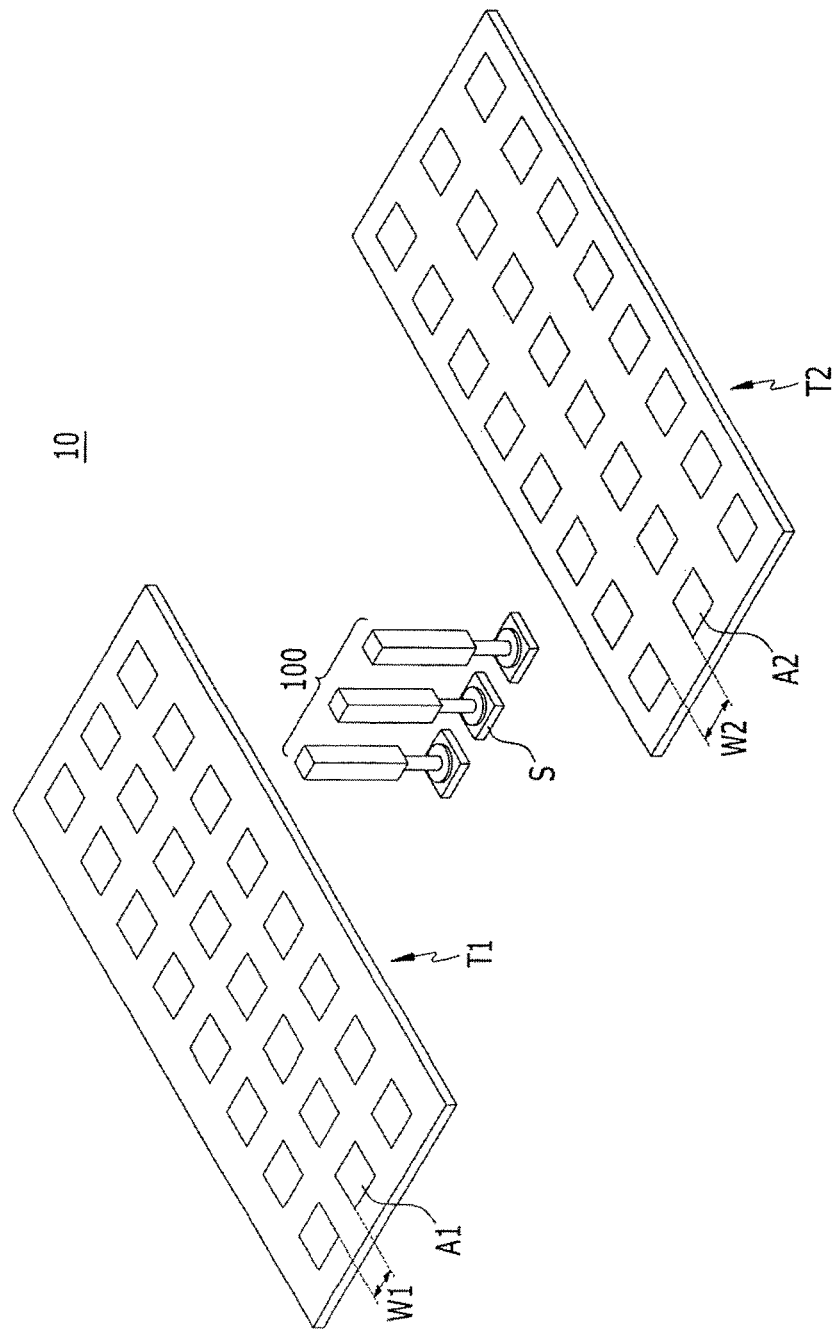
FIG. 1 illustrates an embodiment of a pickup system.
Figure 2:
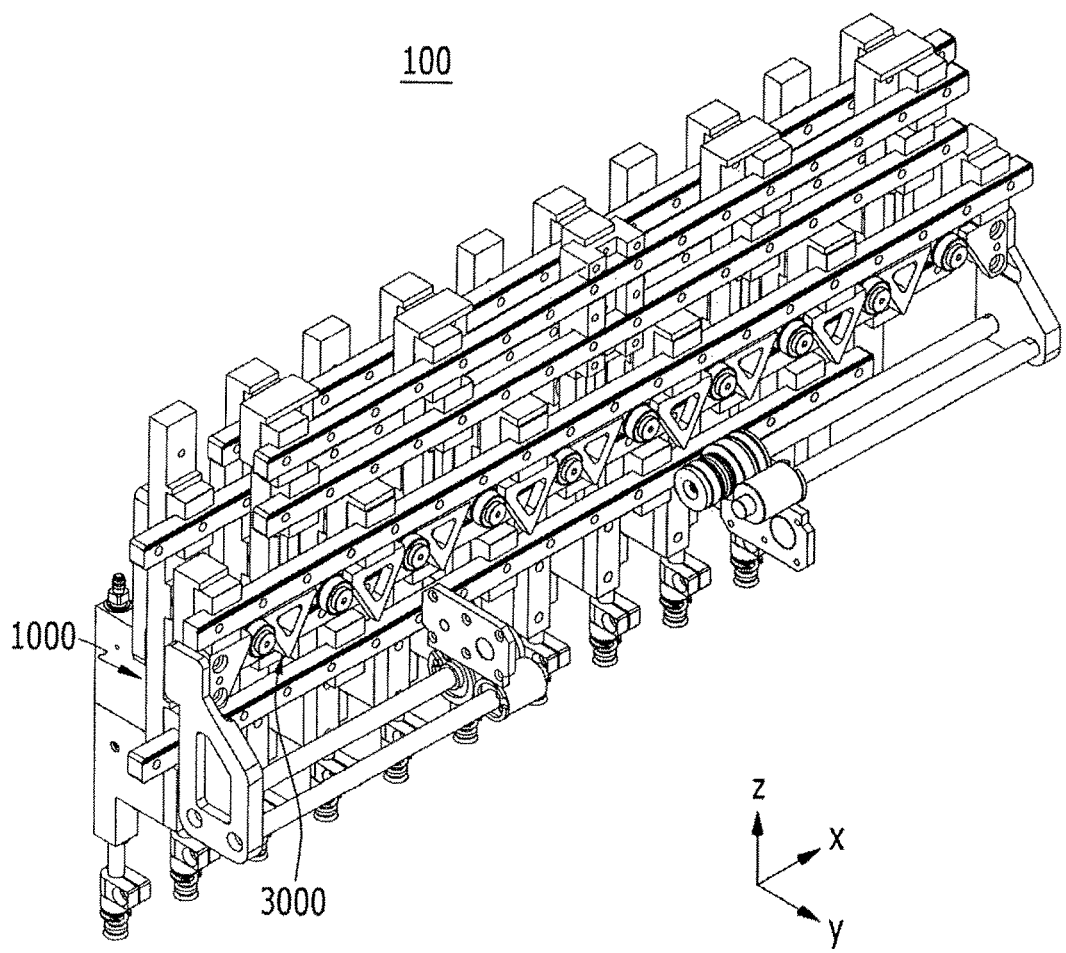
FIG. 2 illustrates an embodiment of a pickup unit.
Figure 3:
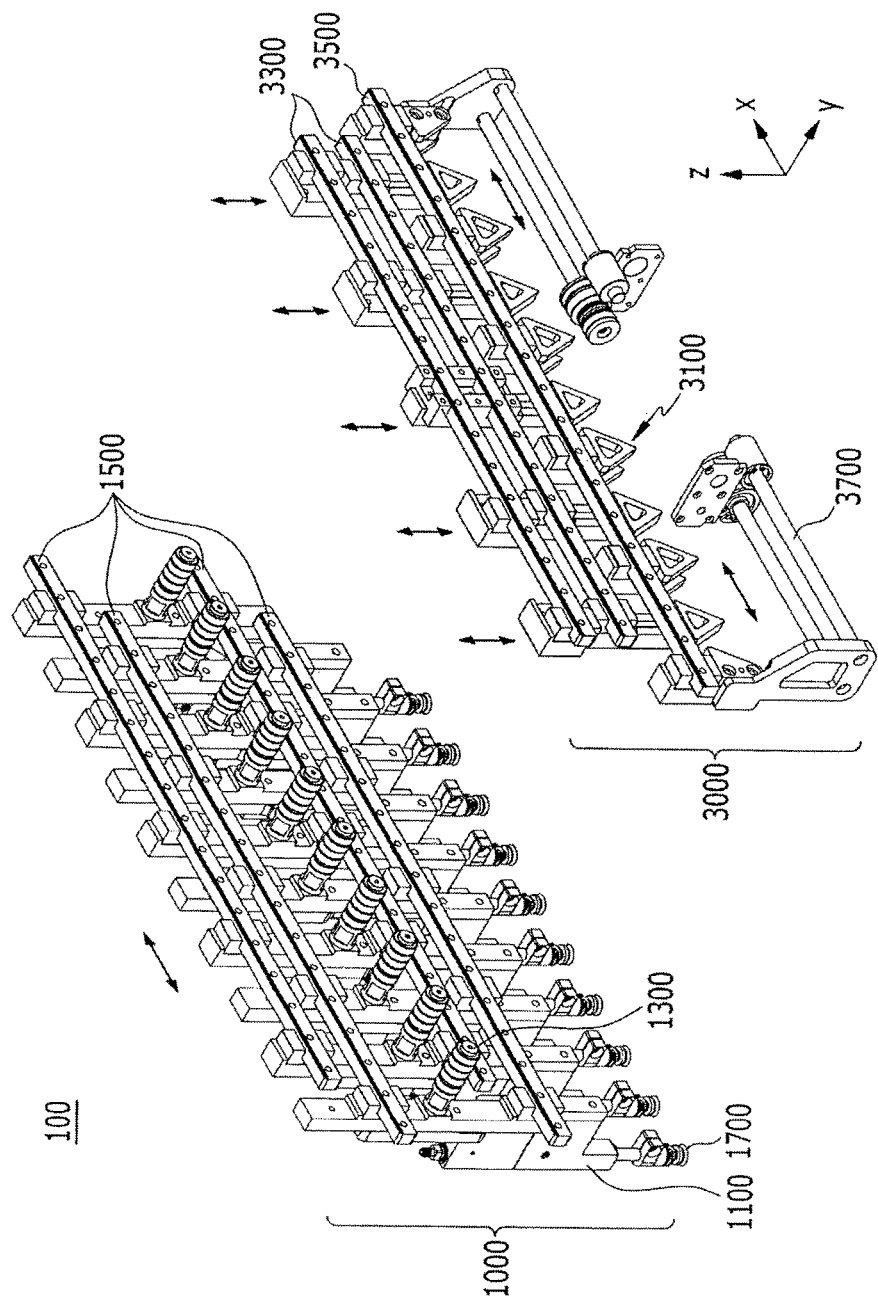
FIG. 3 illustrates an example perspective view of the pickup unit.
Figure 4:
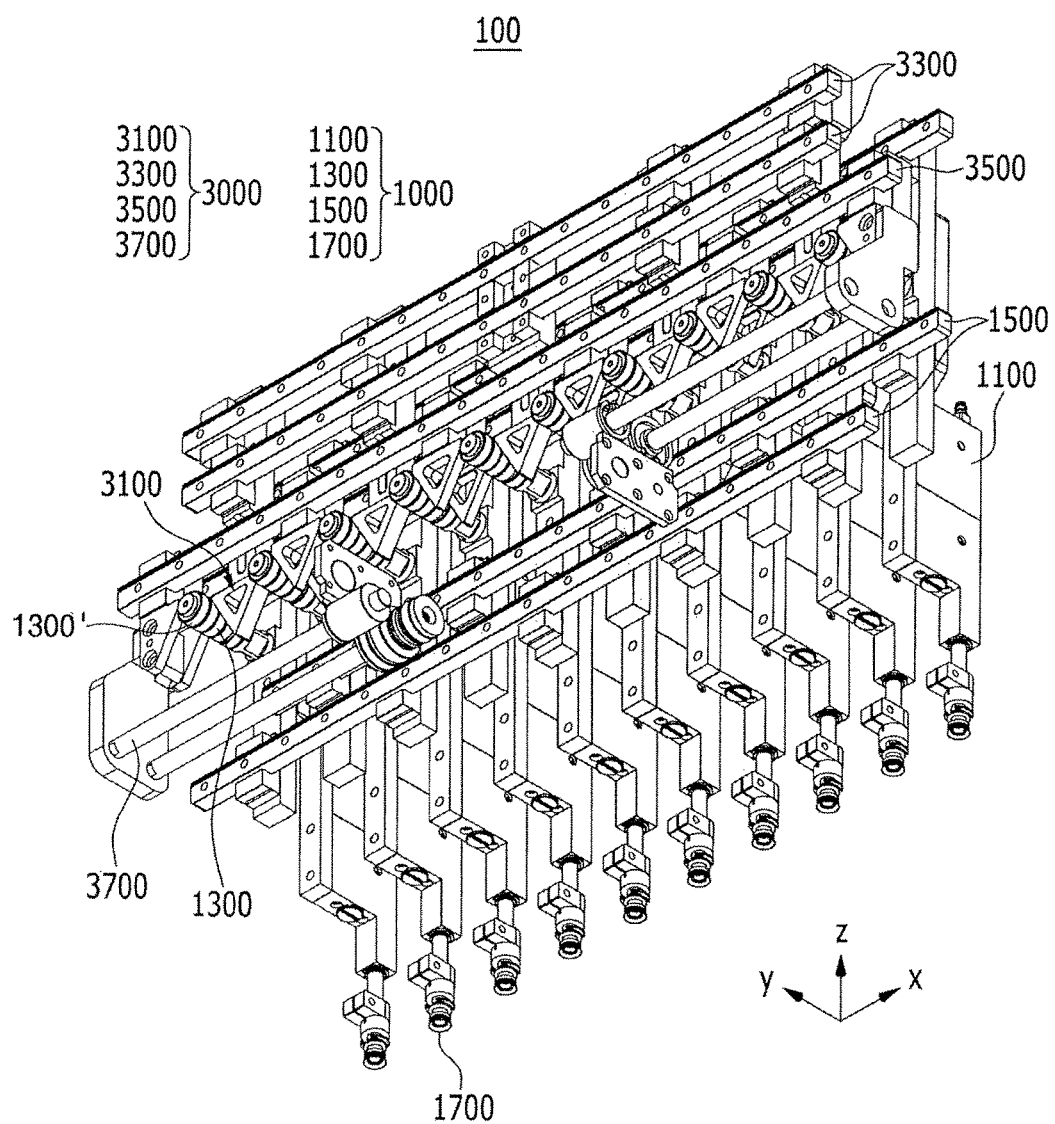
FIG. 4 illustrates another example perspective view of pickup unit.
Figure 5:
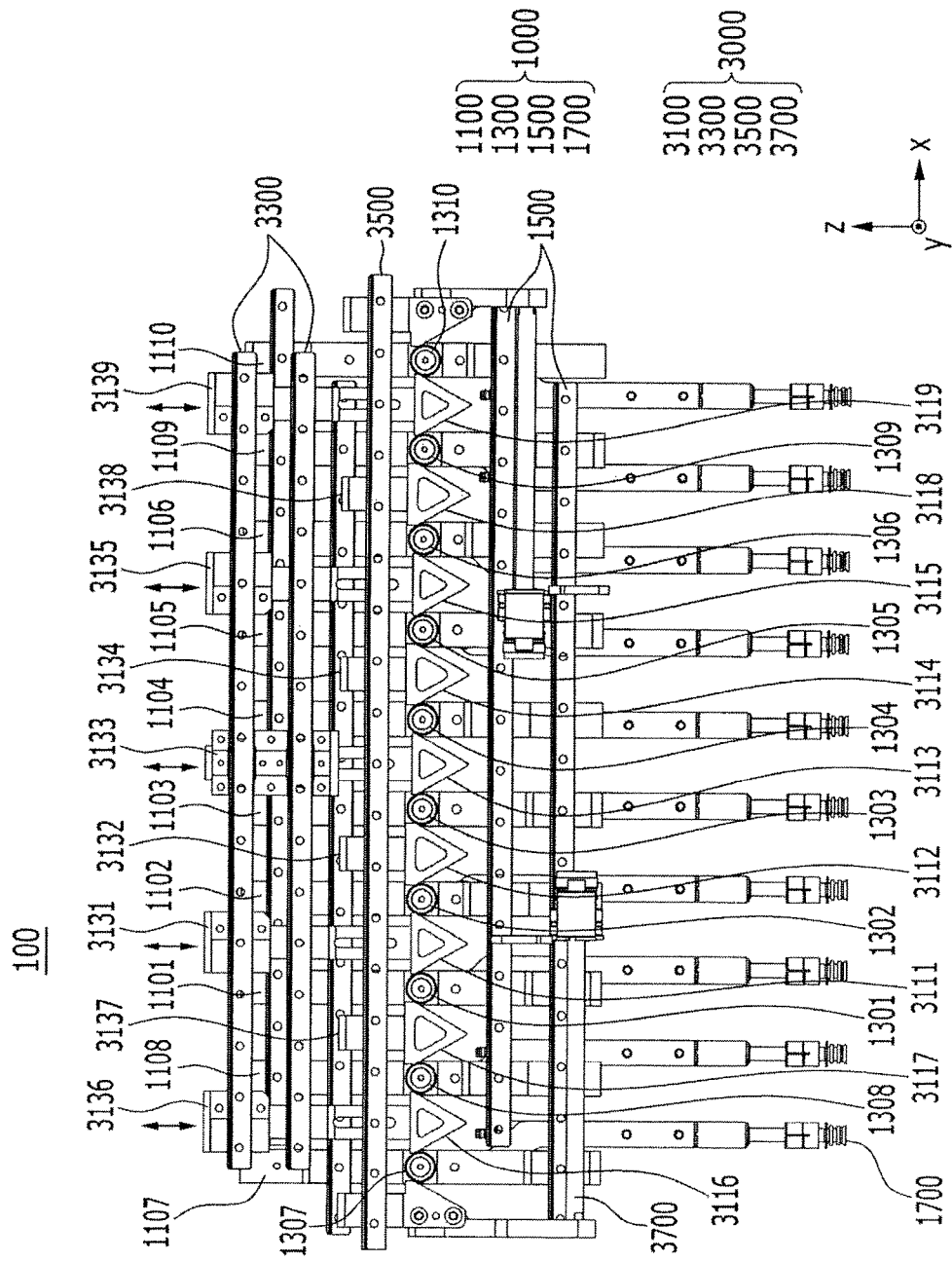
FIG. 5 illustrates an example front view of the pickup unit.
Figure 6:
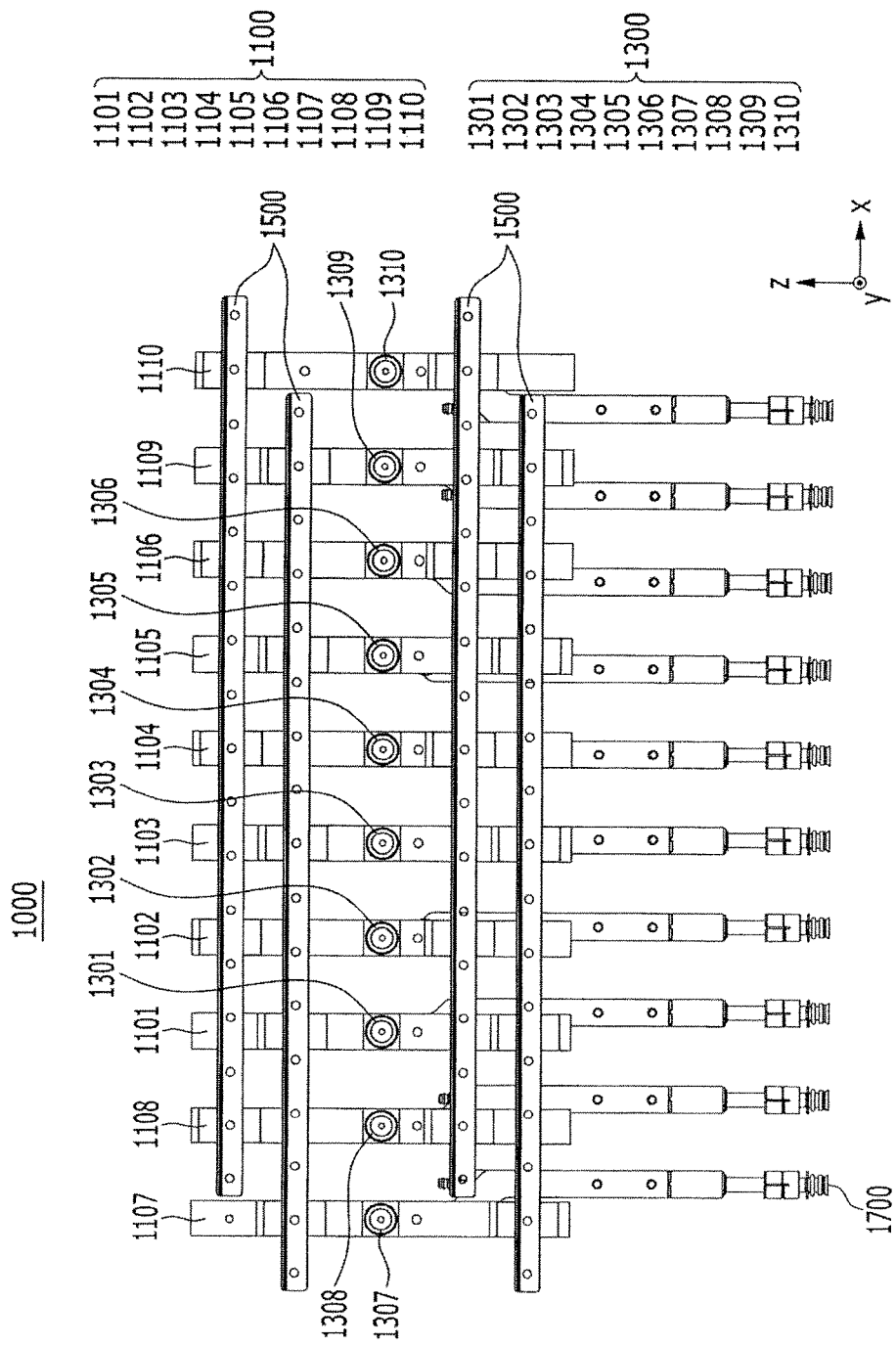
FIG. 6 illustrates an embodiment of a plurality of pickers.
Figure 7:
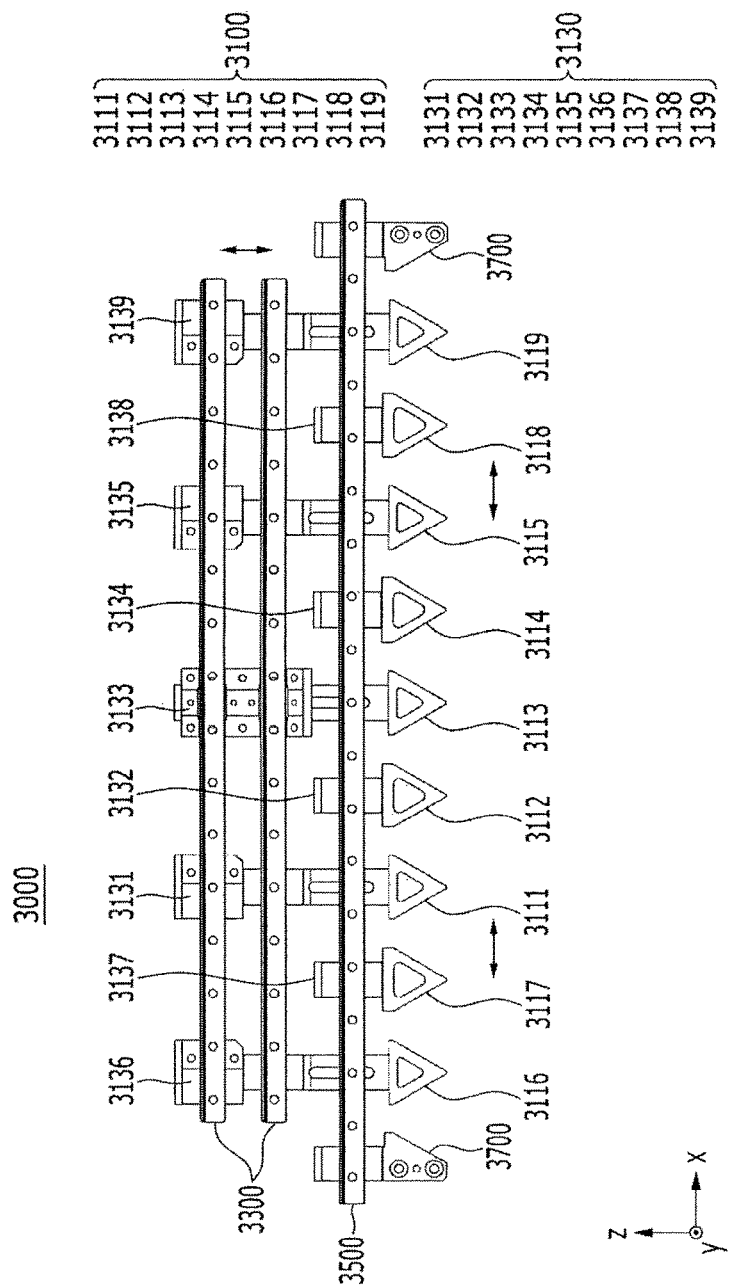
FIG. 7 illustrates an embodiment of a space adjusting part.

FIG. 1 illustrates an embodiment of a pickup system 10. FIG. 2 illustrates an embodiment of a perspective view of a pickup unit 100 in FIG. 1. FIG. 3 illustrates an embodiment of an exploded perspective view of the pickup unit 100. FIG. 4 illustrates an embodiment of a perspective view of the pickup unit 100 when viewed at a different angle. FIG. 5 illustrates an embodiment of a front view of the pickup unit 100. FIG. 6 illustrates an embodiment of a front view of a plurality of pickers 1000 in FIG. 5. FIG. 7 illustrates an embodiment of a front view of a space adjusting part 3000 in FIG. 5.

Referring to FIG. 1, the pickup system 10 may include a first tray T1, a second tray T2, and the pickup unit 100. The pickup unit 100 may transfer semiconductor devices S to the first tray T1 and the second tray T2. The semiconductor devices S may be spaced apart from one another by different distances in the first tray T1 and the second tray T2. The pickup unit 100 may transfer the semiconductor device S from the first tray T1 to the second tray T2, or may transfer the semiconductor device S from the second tray T2 to the first tray T1.

The semiconductor devices S may be placed in the first tray T1 and spaced apart from one another by a first distance W1. The semiconductor devices S may be placed in the second tray T2 and spaced apart from one another by a second distance W2 different from the first distance W1. The first tray T1 may be a transfer tray which transfers a packaged semiconductor device S. The second tray T2 may be a test tray which transfers the semiconductor device S to a test board to be tested. The pickup unit 100 may, for example, automatically control spaces between the plurality of pickers 1000, which pick up and place the semiconductor devices S and transfer the semiconductor device S to the first tray T1 and the second tray T2.

Referring to FIGS. 2 to 7, the pickup unit 100 may include the plurality of pickers 1000 and a space adjusting part (or adjuster) 3000. The pickers 1000 may pick up or place the semiconductor devices S. The space adjusting part 3000 may control distances between the pickers 1000.

Referring to FIGS. 2 to 4, pickers 1000 may attach and detach semiconductor devices S and may be arranged to be slidable along a first direction (X axis). The distances between the pickers 1000 may be controllable. Each picker 1000 may include a picker body 1100, a holding portion 1700, a protruding portion 1300, and a sixth guide rail 1500.

The picker body 1100 may extend along a second direction (Y axis) and may form a negative pressure or a positive pressure for attaching or removing the semiconductor device S with the holding portion 1700. For example, the picker body 1100 may form the negative pressure to suction the semiconductor device S with the holding portion 1700 which is combined with a lower portion of the picker body 1100. The picker body 1100 may form the positive pressure to remove the semiconductor device S from the holding portion 1700. The picker body 1100 may directly form the negative pressure or the positive pressure therein or may receive the negative pressure or the positive pressure from an outer supply source.

The holding portion 1700 may be arranged under the picker body 1100 and may have an opening in a middle portion, which is in communication with the picker body 1100. The holding portion 1700 may be formed, for example, of a resilient material to prevent the semiconductor device S from being damaged when suctioned with the holding portion 1700. The holding portion 1700 may include, for example, rubber or silicon material.

The pickers 1000 may be combined with the sixth guide rail 1500. The sixth guide rail 1500 may guide the pickers 1100 to be slidable along the first direction (X axis). The sixth guide rail 1500 may be, for example, a bar member extending in the first direction (X axis).

The protruding portion 1300 may be combined with the picker body 110 to protrude in a third direction (Y direction). Sidewalls of the protruding portion 1300 may contact a pair of space adjusting plates 3100 adjacent to the protruding portion 1300. In these embodiments, when the pickers 1000 slide along the first direction (X axis), the protruding portion 1300 may slide while contacting the space adjusting plate 3100.

The protruding portion 1300 may include at least one roller 1300'. The roller 1300' may rotate about its own axis parallel with the third direction (Y axis). The roller 1300' may be between the pair of space adjusting plates 3100 and may rotate while contacting the space adjusting plate 3100. Sizes of the rollers applied to the protruding portions 1300 (e.g., diameters of the rollers) may be the same.

In example embodiments, the space adjusting part 3000 may include a plurality of space adjusting plates 3100, a first guide rail 3300, a second guide rail 3500, and a pressurizing portion 3700. The space adjusting plates 3100 may be arranged along the first direction (X axis) and side by side. One protruding portion 1300 may be between a pair of adjacent space adjusting plates 3100. The roller 1300' of the picker 1000 may be between the pair of space adjusting plates 3100 while contacting the pair of space adjusting plates 3100.

The width of each of the space adjusting plates 3100 may decrease gradually from top to bottom along the second direction (Z axis). The space adjusting plate 3100 may have a symmetrical shape with respect to an axis parallel with the second direction (Z axis). For example, the space adjusting plate 3100 may have a triangle shape. As illustrated in FIG. 7, the space adjusting plate 3100 may have an inverted triangle shape.

The space adjusting plate 3100 may have a different shape in another embodiment. For example, as illustrated in FIG. 8, the space adjusting plate 3100 may have a trapezoid shape (FIG. 8A), a semicircle shape (FIG. 8B), or an oval shape (FIG. 8C). In one embodiment, the space adjusting plate 3100 may have a triangle shape symmetric with an inverted triangle shape.

Referring again to FIGS. 2 to 4, some of the space adjusting plates 3100 may be installed in the first guide rail 3300. Other space adjusting plates 3100 may be installed in the second guide rail 3500. In these embodiments, the first guide rail 3300 may be movable upward and downward along the second direction (Z axis). Thus, some of the space adjusting plates 3100 installed in the first guide rail 300 may be movable along the second direction (Z axis).

On the other hand, the second guide rail 3500 may be fixed not to be movable along the second direction (Z axis). For example, some space adjusting plates 3100 installed in the second guide rail 3500 may not be movable along the second direction (Z axis). In one embodiment, the second guide rail 3500 may be movable along the second direction (Z axis) and the first guide rail 3300 may be fixed.

In example embodiments, the space adjusting plates 3100 installed in the first guide rail 3300 and the second guide rail 3500 may be slidable along the first direction (X axis). The space adjusting plates 3100 may slide along the first guide rail 3300 and the second guide rail 3500 in the first direction (X axis).

The pressurizing portion 3700 may pressurize at least one of a pair of pickers 1000 positioned at both edges of the plurality of pickers 1000 in the first direction (X axis). The pressurizing portion 3700 may pressurize the pair of the pickers 1000 toward a middle of the plurality of pickers 1000. For example, the pressurizing portion 3700 may pressurize the pair of pickers 1000, to thereby stick the protruding portions 1300 and the space adjusting plates 3100 to each other. The protruding portion 1300 and the space adjusting plates 3100 in both sidewalls of the protruding portion 1300 may not be spaced apart from one another, by the pressurizing portion 3700. In one embodiment, only one pair of pressurizing portions 3700 may pressurize the picker.

The pressurizing portion 3700 may include, for example, a hydraulic damper, an air damper, a spring or another pressurizing device for pressurizing the space adjusting plate 3100 and the protruding portion 1300 to stick each other.

In one embodiment, the pressurizing portion 3700 may directly pressurize at least one pair of pickers 1000 positioned in both edges of the plurality of pickers 1000 in the first direction (X axis). The pressurizing portion 3700 may pressure the pair of the pickers 1000 toward a middle of the plurality of pickers 1000. For example, the pressurizing portion 3700 may pressurize the pair of pickers 1000, to thereby stick the protruding portions 1300 and the space adjusting plates 3100 to each other. The protruding portion 1300 and the space adjusting plates 3100 in both sidewalls of the protruding portion 1300 may not be spaced apart from one another, by the pressurizing portion 3700.

Referring to FIGS. 5 to 7, a plurality of picker bodies 1100 may be arranged along the first direction (X axis). Picker bodies 1107, 1108, 1101, 1102, 1103, 1104, 1105, 1106, 1109, and 1110 may be arranged sequentially along the first direction (X axis). For example, a protruding portion 1307 may be combined with the picker body 1107, a protruding portion 1308 may be combined with the picker body 1108, a protruding portion 1301 may be combined with the picker body 1101, a protruding portion 1302 may be combined with the picker body 1102, a protruding portion 1302 may be combined with the picker body 1102, a protruding portion 1303 may be combined with the picker body 1103, a protruding portion 1304 may be combined with the picker body 1104, a protruding portion 1305 may be combined with the picker body 1105, a protruding portion 1306 may be combined with the picker body 1106, a protruding portion 1309 may be combined with the picker body 1109, and a protruding portion 1310 may be combined with the picker body 1110. The protruding portion may be, for example, a roller.

The picker bodies 1107, 1108, 1101, 1102, 1103, 1104, 1105, 1106, 1109, and 1110 may be slidable along the sixth guide rail 1500. In these embodiments, a plurality of sixth guide rails 1500 may be arranged parallel with each other.

A plurality of space adjusting plates 3100 may be arranged along the first direction (X axis). Space adjusting plates 3116, 3117, 3111, 3112, 3113, 3114, 3115, 3118, and 3119 may be arranged sequentially along the first direction (X axis).

A connection bar 3136 may be combined with the space adjusting plate 3116, a connection bar 3137 may be combined with the space adjusting plate 3117, a connection bar 3131 may be combined with the space adjusting plate 3111, a connection bar 3132 may be combined with the space adjusting plate 3112, a connection bar 3133 may be combined with the space adjusting plate 3113, a connection bar 3134 may be combined with the space adjusting plate 3114, a connection bar 3135 may be combined with the space adjusting plate 3115, a connection bar 3138 may be combined with the space adjusting plate 3118, and a connection bar 3139 may be combined with the space adjusting plate 3119. The connection bars 3131, 3132, 3133, 3134, 3135, 3136, 3137, 3138, and 3139 may have, for example, a bar shape extending in the second direction (Z axis).

The space adjusting plates 3116, 3111, 3113, 3115, and 3119 may be installed in the first guide rail 3300. The space adjusting plates 3116, 3111, 3113, 3115, and 3119 may be installed to be slidable along the first guide rail 3300 in the first direction (X axis). In these embodiments, the space adjusting plate 3113 of the space adjusting plates 3116, 3111, 3113, 3115, and 3119 may be fixed not to be slidable along the first direction (X axis).

The first guide rail 3300 may be movable upward and downward along the second direction (Z axis). Thus, the space adjusting plates 3116, 3111, 3113, 3115, and 3119 may be movable along the second direction (Z axis). In these embodiments, the first guide rail 3300 may be movable along the second direction (Z axis) by a motor and a ball screw.

The space adjusting plates 3117, 3112, 3114, and 3118 may be installed in the second guide rail 3500. The space adjusting plates 3117, 3112, 3114, and 3118 may be installed to be slidable along the second guide rail 3500 in the second direction (X axis). In these embodiments, the second guide rail 3500 may not be movable upward and downward along the second direction (Z axis). Thus, the space adjusting plates 3117, 3112, 3114 and 3118 may not be movable along the second direction (Z axis).

Referring to FIG. 5, the space adjusting plate 3116 may be between the protruding portion 1307 and the protruding portion 1308. The space adjusting plate 3117 may be between the protruding portion 1308 and the protruding portion 1301. The space adjusting plate 3111 may be between the protruding portion 1301 and the protruding portion 1302. The space adjusting plate 3112 may be between the protruding portion 1302 and the protruding portion 1303. The space adjusting plate 3113 may be between the protruding portion 1303 and the protruding portion 1304. The space adjusting plate 3114 may be between the protruding portion 1304 and the protruding portion 1305. The space adjusting plate 3115 may be between the protruding portion 1305 and the protruding portion 1306. The space adjusting plate 3118 may be between the protruding portion 1306 and the protruding portion 1309. The space adjusting plate 3119 may be between the protruding portion 1309 and the protruding portion 1310.

The pressurizing portions 3700 may be engaged with the protruding portion 1307 and the protruding portion 1310 respectively. For example, the pressurizing portion 3700 engaged with the protruding portion 1307 may pressurize the protruding portion 1307 from the left to the right (when viewed in FIG. 5). The pressurizing portion 3700 engaged with the protruding portion 1310 may pressurize the protruding portion 1310 from the right to the left (when viewed in FIG. 5).

Figure 9:
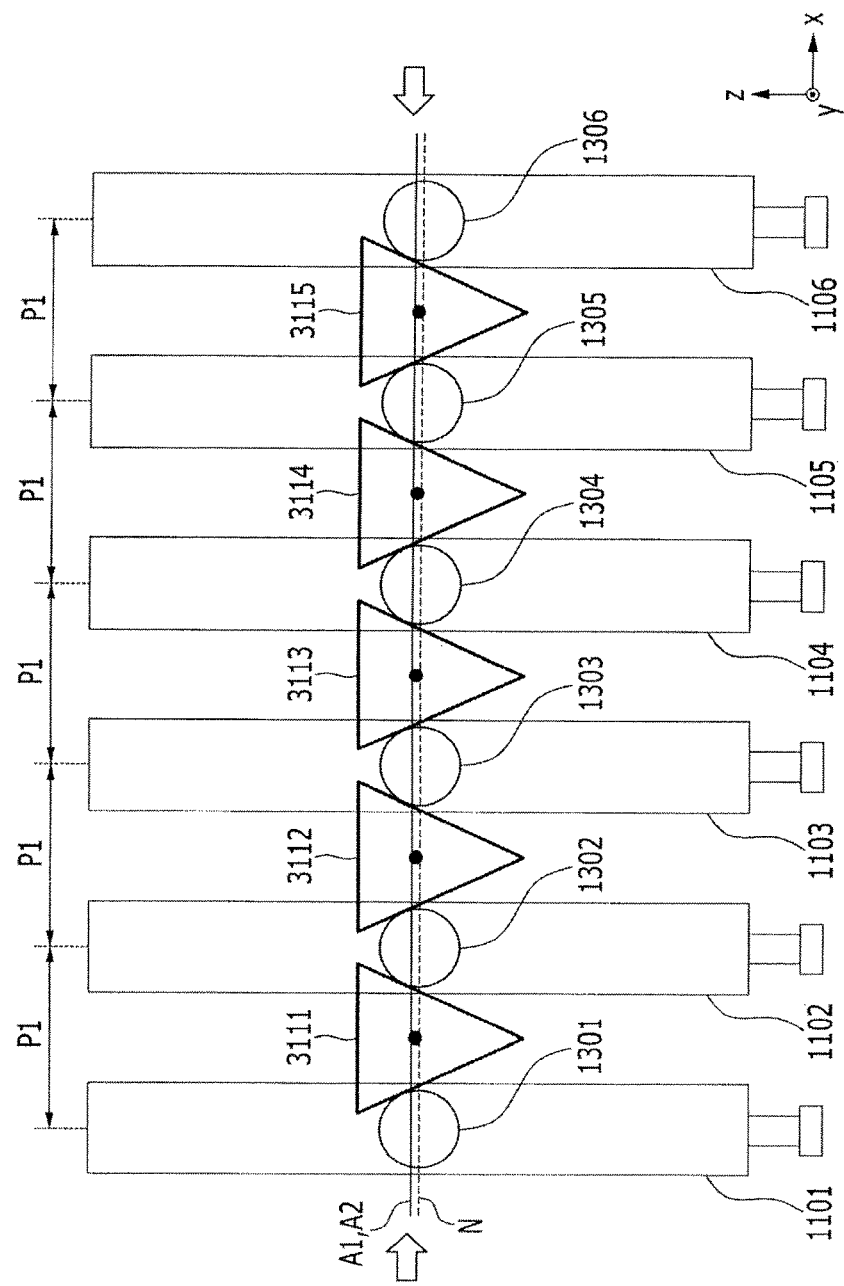
FIGS. 9 and 10 illustrate embodiments of operations of the pickup unit.
Figure 10:
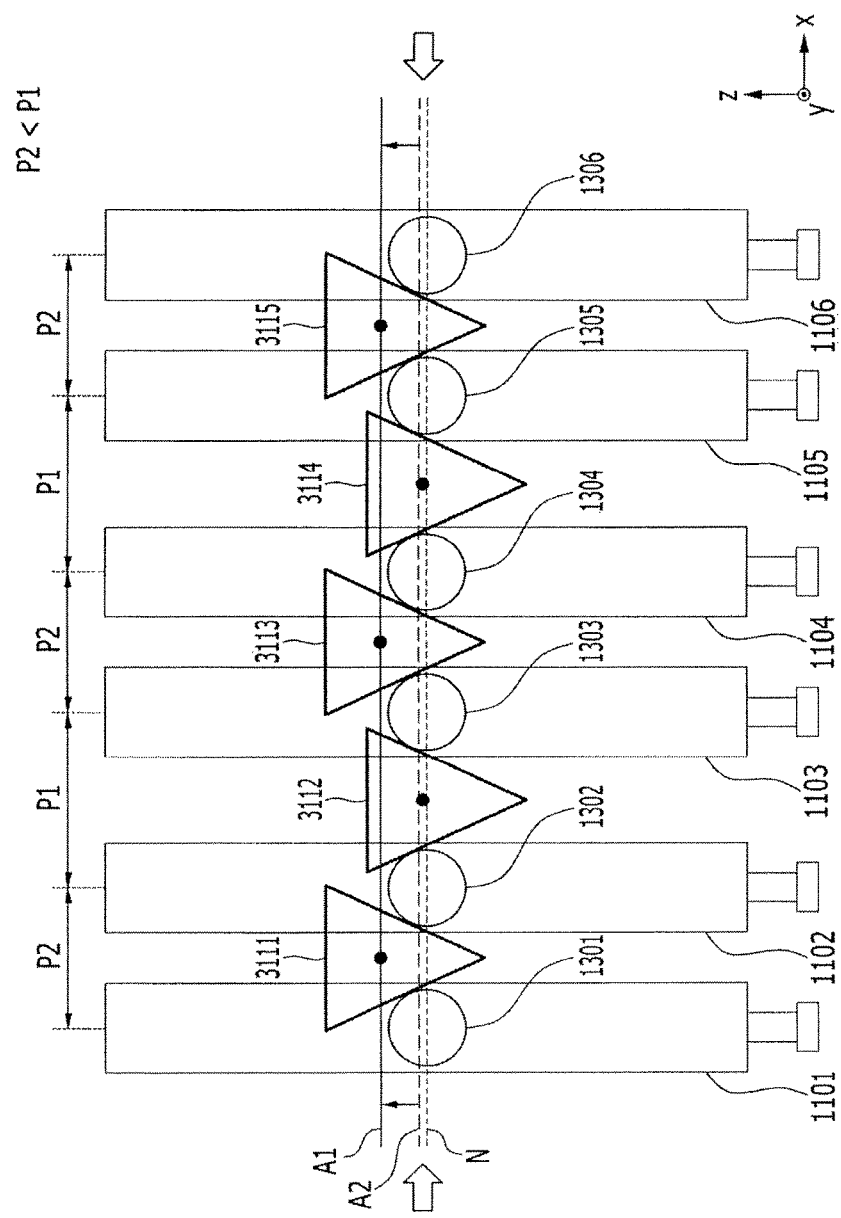

FIGS. 9 and 10 illustrate embodiments of processes for controlling distances of the pickers 1000 using the space adjusting part 300. For example, FIGS. 9 and 10 illustrate embodiments of the operation of pickup unit in FIG. 2, along with a portion of the pickers 1000 and the space adjusting part 3000 in FIG. 5.

Referring to FIG. 9, space adjusting plate 3111 may be between the protruding portion 1301 and the protruding portion 1302. The space adjusting plate 3112 may be between the protruding portion 1302 and the protruding portion 1303. The space adjusting plate 3113 may be between the protruding portion 1303 and the protruding portion 1304. The space adjusting plate 3114 may be between the protruding portion 1304 and the protruding portion 1305. The space adjusting plate 3115 may be between the protruding portion 1305 and the protruding portion 1306. Centers of protruding portions 1301, 1302, 1303, 1304, 1305, and 1306 may be aligned on imaginary line N.

The space adjusting plates 3111, 3112, 3113, 3114, and 3115 may be arranged along the first direction (X axis), for example, at a same height. Because the space adjusting plates 3111, 3112, 3113, 3114, and 3115 has the same inverted triangle shape, distances between the protruding portions 1301, 1302, 1303, 1304, 1305, and 1306 between the space adjusting plates 3111, 3112, 3113, 3114 and 3115 may be the same. The distance between a pair of adjacent ones of the protruding portions 1301, 1302, 1303, 1304, 1305, and 1306 may be the same.

Because the distances between the protruding portions are the same, pitches P1 between the picker bodies 1101, 1102, 1103, 1104, 1105, and 1106 may be the same. The pitch P1 between a pair of adjacent ones of the picker bodies 1101, 1102, 1103, 1104, 1105, and 1106 may be the same.

The space adjusting plates 3111, 3113, and 3115 may be installed in the first guide rail 3300 (e.g., see FIG. 5). In FIGS. 9 and 10, the first guide rail 3300 may be referred to as an imaginary line A1. The space adjusting plates 3112 and 3114 may be installed in the second guide rail 3500. In FIGS. 9 and 10, the second guide rail 3500 may be referred to as an imaginary line A2.

Referring to FIG. 10, the first guide rail A1 may move upward along the second direction (Z axis). Thus, the space adjusting plates 3111, 3113, and 3115 installed in the first guide rail A1 may move upward along the second direction (Z axis). In this case, because the second guide rail A2 does not move along the second direction (Z axis), the space adjusting plates 3112 and 3114 may not move.

As illustrated in FIG. 10, as the space adjusting plates 3111, 3113, and 3115 move upward, the distances between the protruding portions 1301, 1302, 1304, 1305, and 1306 contacting sidewalls of the space adjusting plates 3111, 3113, and 3115 may be changed. For example, the distance between the protruding portions 1301 and 1302 contacting sidewalls of the space adjusting plate 3111 may be decreased. The distance between the protruding portions 1303 and 1304 contacting sidewalls of the space adjusting plate 3113 may be decreased. The distance between the protruding portions 1305 and 1306 contacting sidewalls of the space adjusting plate 3115 may be decreased.

In these embodiments, the distance between the protruding portions 1301 and 1302, the distance between the protruding portions 1303 and 1304, and the distance between the protruding portions 1305 and 1306 may be determined, for example, by widths of the space adjusting plates 3111, 3113, and 3115 between the protruding portions respectively. For example, the distance between the protruding portions 1301 and 1302 may be determined by the width of the space adjusting plate 3111. The distance between the protruding portions 1303 and 1304 may be determined by the width of the space adjusting plate 3113. The distance between the protruding portions 1305 and 1306 may be determined by the width of the space adjusting plate 3115.

In FIG. 10, as the space adjusting plates 3111, 3113, and 3115 move upward along the second direction (Z axis), the widths of the space adjusting plates 3111, 3113, and 3115 between the protruding portions (e.g., the distance between the protruding portions) may be decreased. Thus, as the distance between the protruding portions 1301 and 1302, the distance between the protruding portions 1303 and 1304, and the distance between the protruding portions 1305 and 1306 are decreased respectively, the distance between the picker bodies 1101 and the 1102, the distance between the picker bodies 1103 and 1104, and the distance between the picker bodies 1105 and 1107 may be decreased from the pitch P1 to a second pitch P2.

Additionally, the distance between the protruding portions 1302 and 1303 and the distance between the protruding portions 1304 and 1305 may be determined based on the widths of the space adjusting plates 3112 and 3114 between the protruding portions respectively. For example, the distance between the protruding portions 1302 and 1303 may be determined by the width of the space adjusting plate 3112 between the protruding portions 1302 and 1303. The distance between the protruding portions 1304 and 1305 may be determined by the width of the space adjusting plate 3114 between the protruding portions 1304 and 1305. In FIG. 10, because the space adjusting plates 3112 and 3114 do not move along the second direction (Z axis), the widths of the space adjusting plates 3112 and 3114 may remain P1.

In these embodiments, the first guide rail A1 moves upward along the second direction (Z axis) and the second guide rail A2 does not move. In one embodiment, the second guide rail A2 may move upward along the second direction (Z axis). In this case, because the second guide rail A2 moves upward at a height equal to the first guide rail A1, the distance between the picker bodies 1102 and 1103 and the distance between the picker bodies 1104 and 1105 may be decreased from pitch P1 to second pitch P2.

In one embodiment, the second guide rail A2 may move upward at a height different from the height at which the first guide rail A1 moves upward. Thus, the distance between the picker bodies 1102 and 1103 and the distance between the picker bodies 1104 and 1105 may be adjusted so that the pitch is different from pitch P1 or pitch P2 in FIG. 9.

Figure 11:
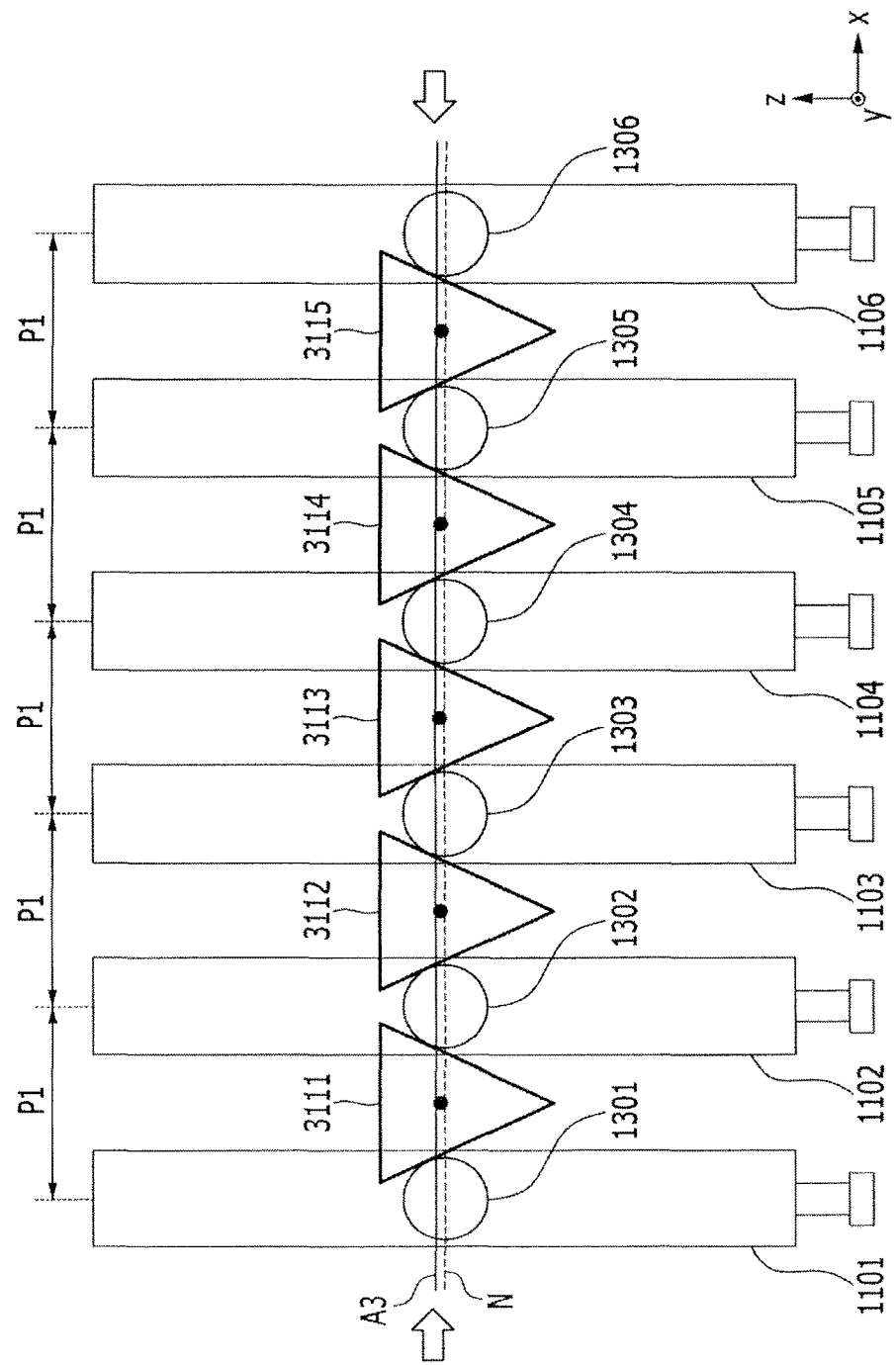
FIGS. 11 and 12 illustrate embodiments of operations of the space adjusting part.
Figure 12:
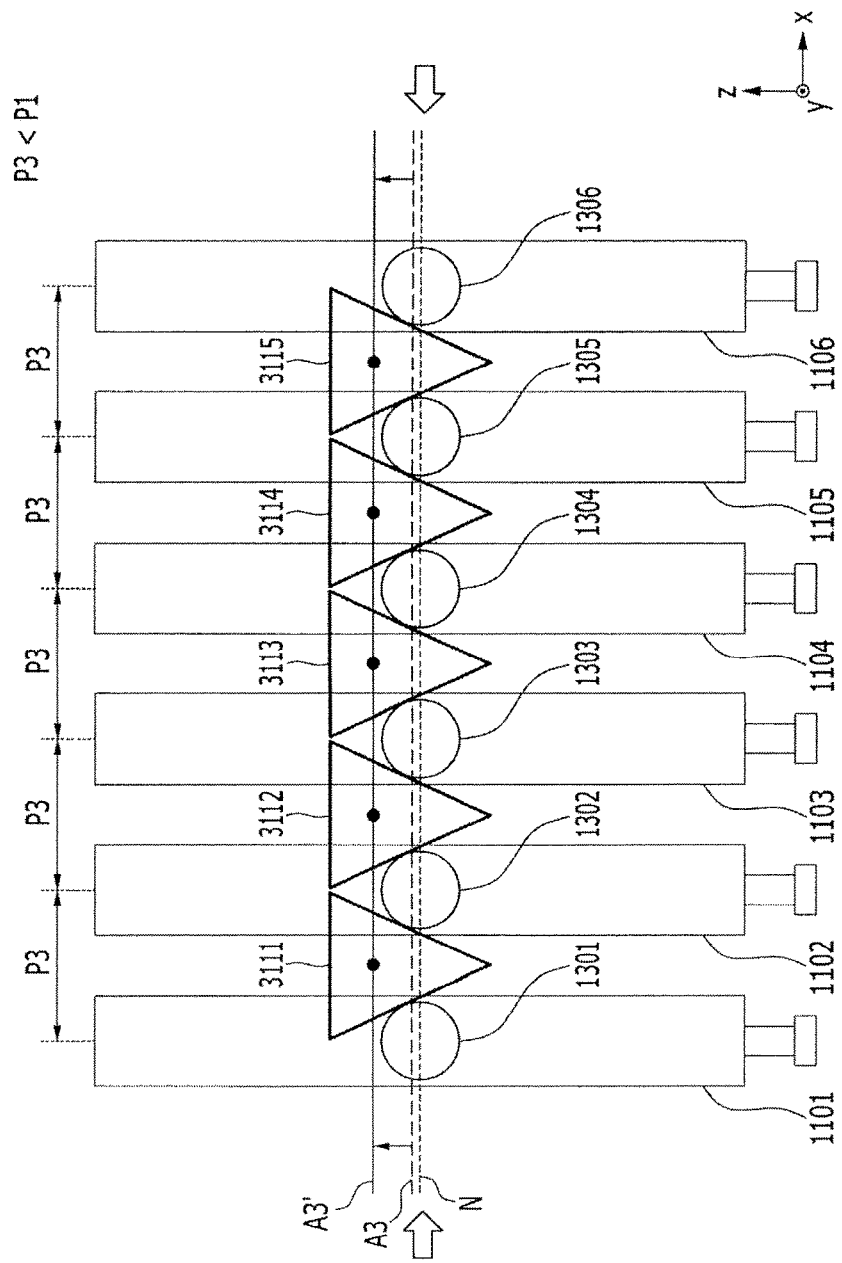

FIGS. 11 and 12 illustrates additional embodiments of operations of the space adjusting part in FIG. 9. Referring to FIGS. 11 and 12, space adjusting plates 3111, 3112, 3113, 3114, and 3115 may be installed in a third guide rail A3. As the third guide rail A3 moves upward along a second direction (Z axis), the space adjusting plates 3111, 3112, 3113, 3114, and 3115 may move upward along the second direction (Z axis). In FIGS. 9 and 10, some of the space adjusting plates 3111, 3112, 3113, 3114, and 3115 and others of the space adjusting plates 3111, 3112, 3113, 3114, and 3115 may be installed in the first guide rail A1 and the second guide rail A2, respectively. However, in FIGS. 11 and 12, the space adjusting plates 3111, 3112, 3113, 3114, and 3115 may be installed in one third guide rail A3.

Thus, as the third guide rail A3 moves upward along the second direction (Z axis), the distance between protruding portions 1301 and 1302, the distance between protruding portions 1302 and 1303, the distance between protruding portions 1303 and 1304, the distance between protruding portions 1304 and 1305, and the distance between protruding portions 1305 and 1306 may decrease from pitch P1 to pitch P3.

In FIGS. 11 and 12, the pressurizing portion 3700 (e.g., see FIG. 5) may pressurize the protruding portions 1301 and 1306, to thereby stick the space adjusting plates 3111, 3112, 3113, 3114, and 3115 to the protruding portions 1301, 1302, 1303, 1304, 1305 and 1306. The pressurizing portion 3700 may include a hydraulic damper, an air damper, a spring, or another type of pressurizing apparatus.

Figure 13:
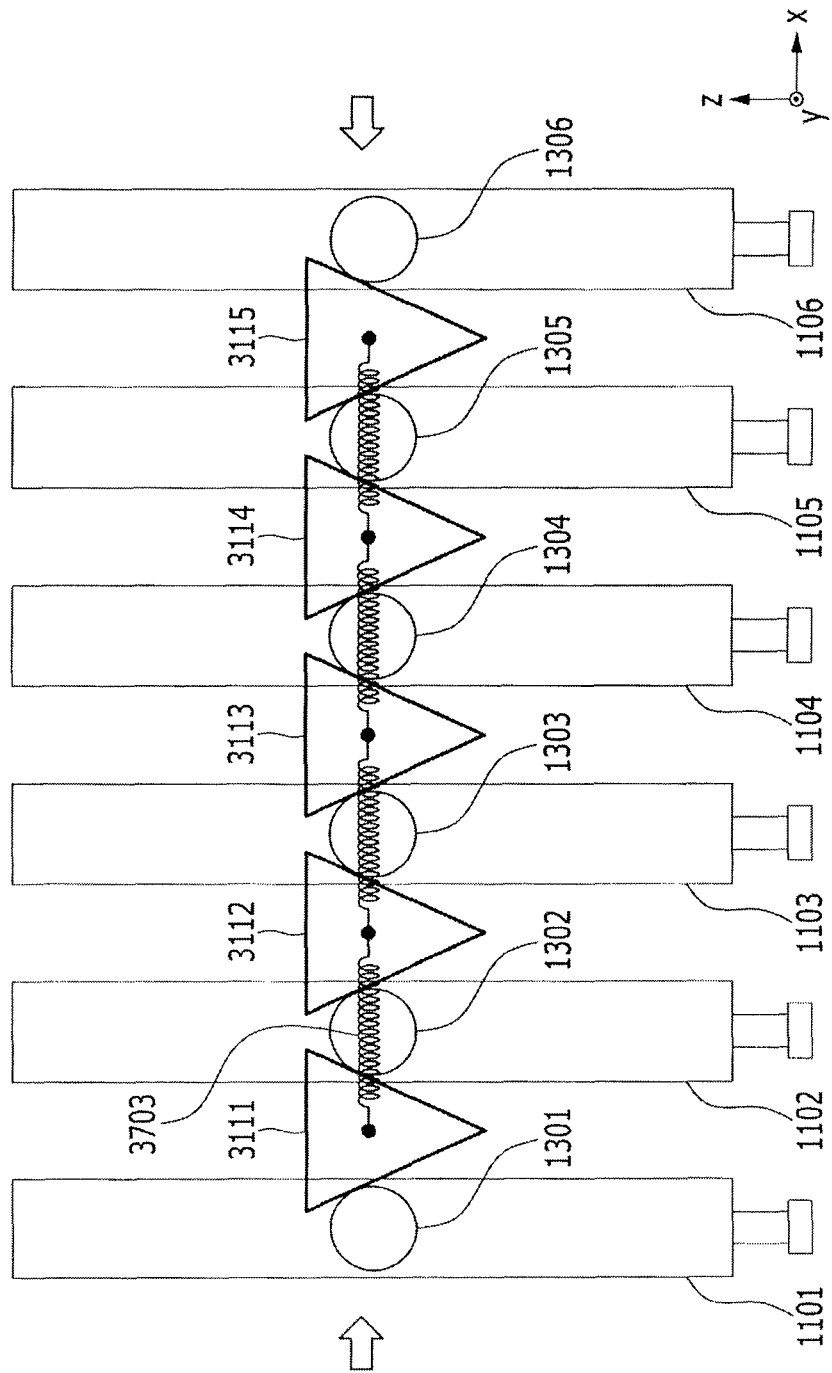
FIG. 13 illustrates an embodiment of a pressurizing portion.

Referring to FIG. 13, springs 3703 may be combined between the adjacent space adjusting plates 3111, 3112, 3113, 3114, and 3115. For example, the spring 3703 may be connected between the space adjusting plate 3111 and 3112, the spring 3703 may be connected between the space adjusting plate 3112 and 3113, the spring 3703 may be connected between the space adjusting plate 3113 and 3114, and the spring 3703 may be connected between the space adjusting plate 3114 and 3115.

Figure 14:
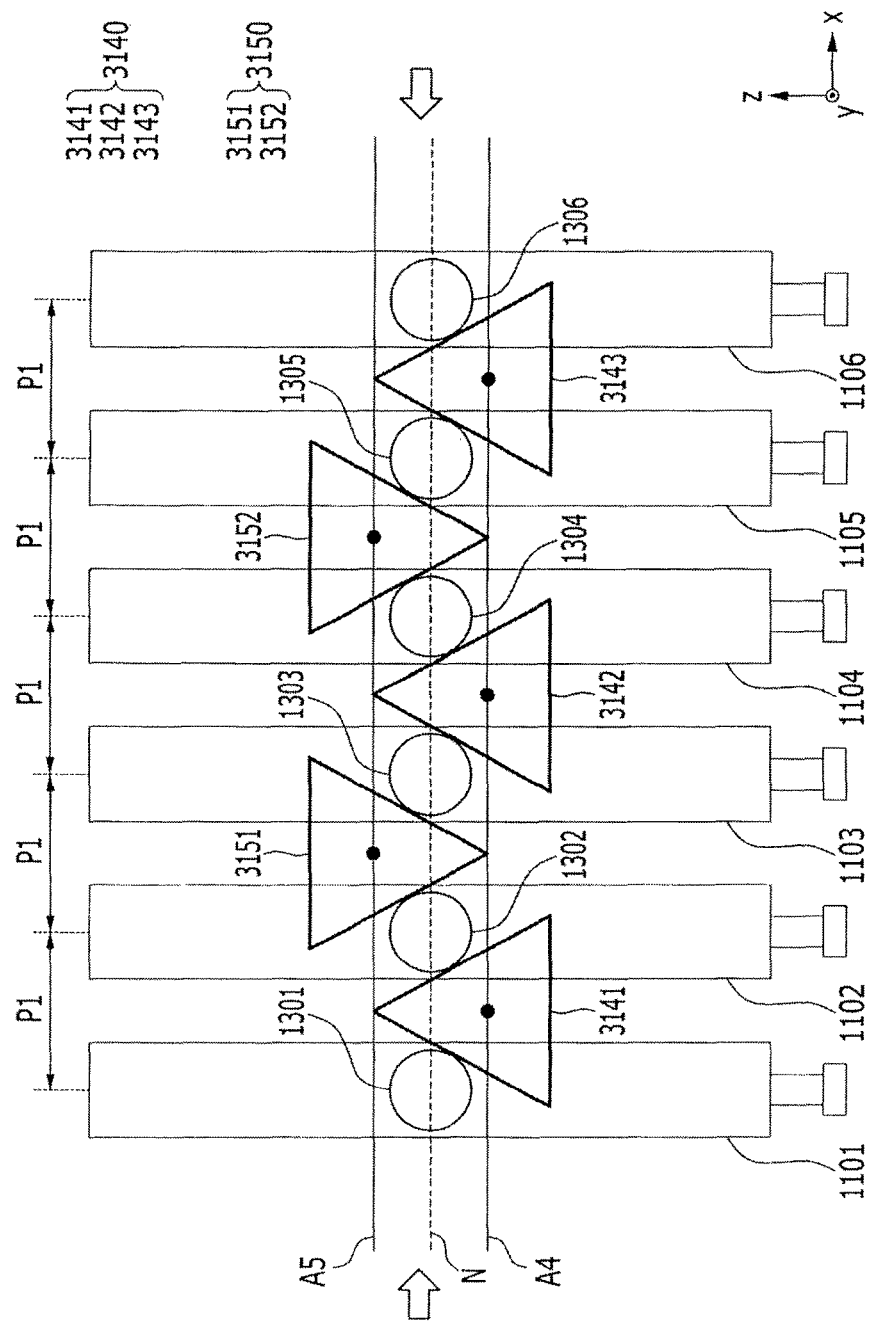
FIGS. 14 to 17 illustrate embodiments of operations of the space adjusting part.

FIGS. 14 to 17 illustrates additional embodiments of operations of the space adjusting part in FIG. 9. Referring to FIG. 14, a plurality of space adjusting plates 3100 may include a first row of space adjusting plates 3140 and a second row of space adjusting plates 3150.

The first row of space adjusting plates 3140 may be arranged along a first direction (X axis) and may have a width which increases gradually from top to bottom. For example, the first row of space adjusting plates 3140 may have a triangle shape. In one embodiment, the first row of space adjusting plates 3140 may have another shape, e.g., a trapezoid shape, a semicircle shape, an oval shape, or another shape.

The first row of space adjusting plates 3140 may be installed in a fourth guide rail A4. The fourth guide rail A4 may move upward and downward along a second direction (Z axis). Thus, the first row of space adjusting plates 3140 installed in the fourth guide rail A4 may move along the second direction (Z axis). The first row of the space adjusting plates 3140 may be installed in the fourth guide rail A4 to be slidable along the first direction (X axis). For example, the first row of space adjusting plates 3140 may slide along the fourth guide rail A4 in the first direction (X axis).

The second row of space adjusting plates 3150 may be arranged along the first direction (X axis) and may have a width which decreases gradually from top to bottom. For example, the second row of space adjusting plates 3150 may have an inverted triangle shape. For example, the second row of space adjusting plate 3150 may have a symmetric shape with the first row of space adjusting plate 3140 on an axis parallel with the first direction (X axis).

Each of the second row of space adjusting plates 3150 may be between a pair of the first row of space adjusting plates 3140 adjacent to each other. For example, the second row of space adjusting plate 3151 may be between a pair of the first row of space adjusting plates 3141 and 3142. The second row of space adjusting plate 3152 may be between a pair of the second row of space adjusting plates 3142 and 3143.

The second row of space adjusting plates 3150 may be installed in a fifth guide rail A5. The fifth guide rail A5 may move upward and downward along the second direction (Z axis). Thus, the second row of space adjusting plates 3150 installed in the fifth guide rail A5 may move along the second direction (Z axis). The second row of the space adjusting plates 3150 may be installed in the fifth guide rail A5 to be slidable along the first direction (X axis). That is, the second row of space adjusting plates 3150 may slide along the fifth guide rail A5 in the first direction (X axis).

In this case, the first row of space adjusting plates 3140 and the second row of space adjusting plates 3150 may be symmetrical with respect to the axis parallel with the first direction (X axis) and may have same size.

The first row of space adjusting plate 3141 may be between the protruding portions 1301 and 1302. The second row of space adjusting plate 3151 may be between the protruding portions 1302 and 1303. The first row of space adjusting plate 3142 may be between the protruding portions 1303 and 1304. The second row of space adjusting plate 3152 may be between the protruding portions 1304 and 1305. The first row of space adjusting plate 3143 may be between the protruding portions 1305 and 1306. In FIG. 14, the first row of space adjusting plates 3140 and the second row of space adjusting plates 3150 may be positioned so that distances between pairs of adjacent protruding portions 1301, 1302, 1303, 1304, 1305, and 1306 may be the same.

Figure 15:
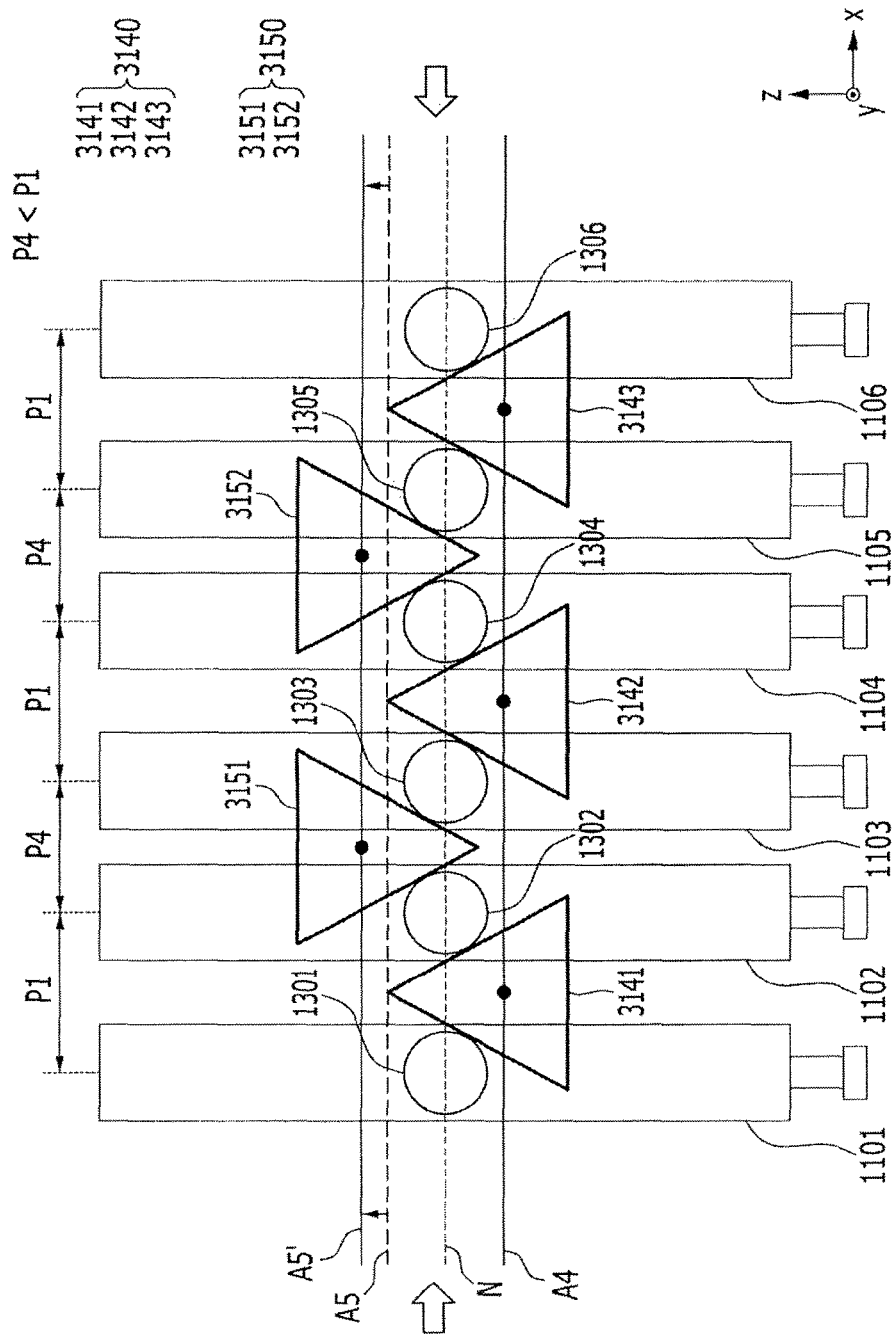

Referring to FIG. 15, the fifth guide rail A5 may move upward along the second direction (Z axis). Thus, the second row of space adjusting plates 3150 installed in the fifth guide rail A5 may move upward along the second direction (Z axis). Because the fourth guide rail A4 does not move along the second direction (Z axis), the first row of space adjusting plates 3140 may not move.

As the second row of space adjusting plates 3150 moves upward, the distance between the protruding portions 1302 and 1303 and the distance between the protruding portions 1304 and 1305 may be decreased, while the distance between the protruding portions 1301 and 1302, the distance between the protruding portions 1303 and 1304, and the distance between the protruding portions 1305 and 1306 may remain the same.

As the distance between the between the protruding portions 1302 and 1303 and the distance between the protruding portions 1304 and 1305 are decreased, the distance between the picker bodies 1102 and 1103 and the distance between the picker bodies 1104 and 1105 may be decreased from pitch P1 to pitch P4. On the other hand, the distance between the picker bodies 1101 and 1102, the distance between the picker bodies 1103 and 1104, and the distance between the picker bodies 1105 and 1106 may remain the pitch P1.

Figure 16:
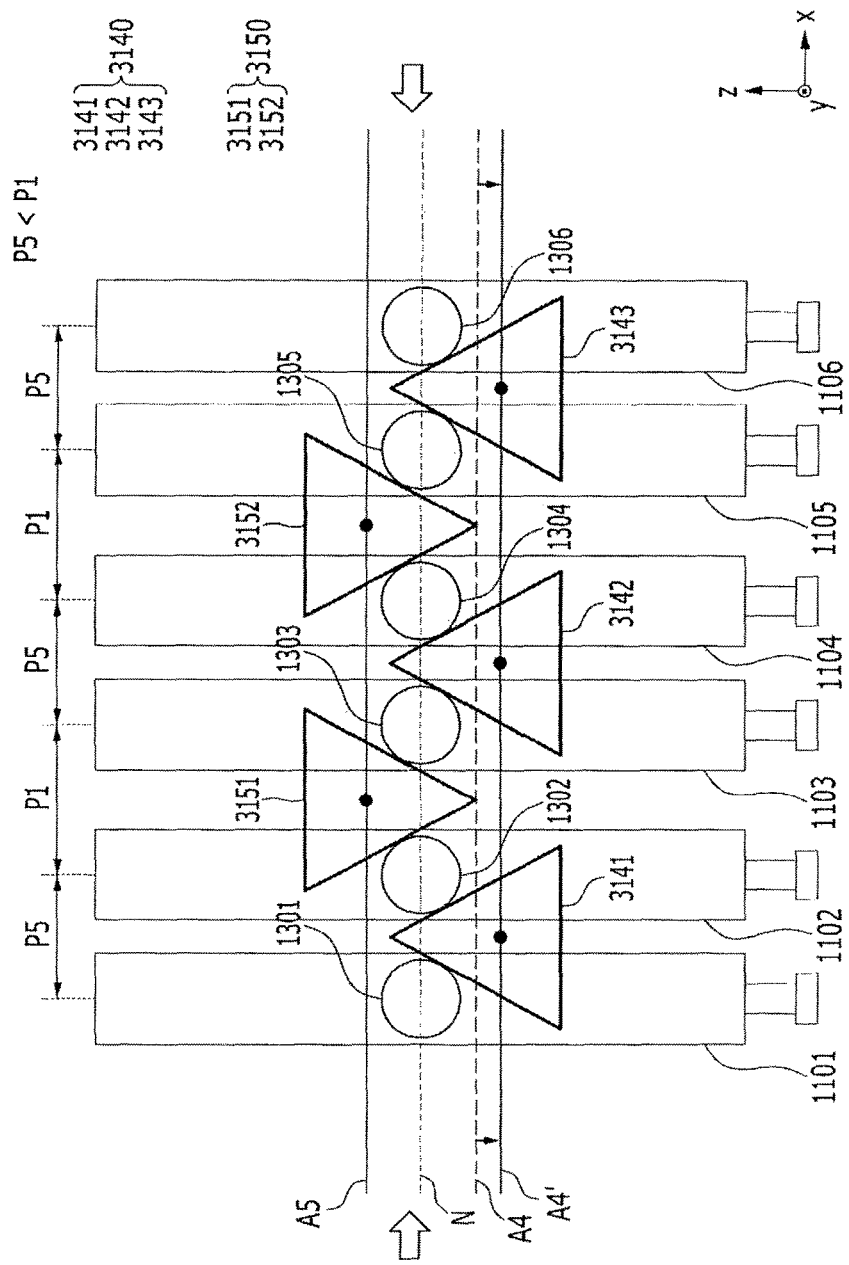

Referring to FIG. 16, the fourth guide rail A4 may move downward along the second direction (Z axis). Thus, the first row of space adjusting plates 3140 installed in the fourth guide rail A4 may move downward along the second direction (Z axis). Because the fifth guide rail A5 does not move along the second direction (Z axis), the second row of space adjusting plates 3150 may not move.

As the first row of space adjusting plates 3140 moves downward, the distance between the protruding portions 1301 and 1302, the distance between the protruding portions 1303 and 1304, and the distance between the protruding portions 1305 and 1306 may be decreased, while the distance between the protruding portions 1302 and 1303 and the distance between the protruding portions 1304 and 1305 may remain the same.

As the distance between the between the protruding portions 1301 and 1302, the distance between the protruding portions 1303 and 1304, and the distance between the protruding portions 1305 and 1306 are decreased, the distance between the picker bodies 1101 and 1102 and the distance between the picker bodies 1105 and 1106 may be decreased from pitch P1 to pitch P5. On the other hand, the distance between the picker bodies 1102 and 1103 and the distance between the picker bodies 1104 and 1105 may remain the pitch P1.

Figure 17:
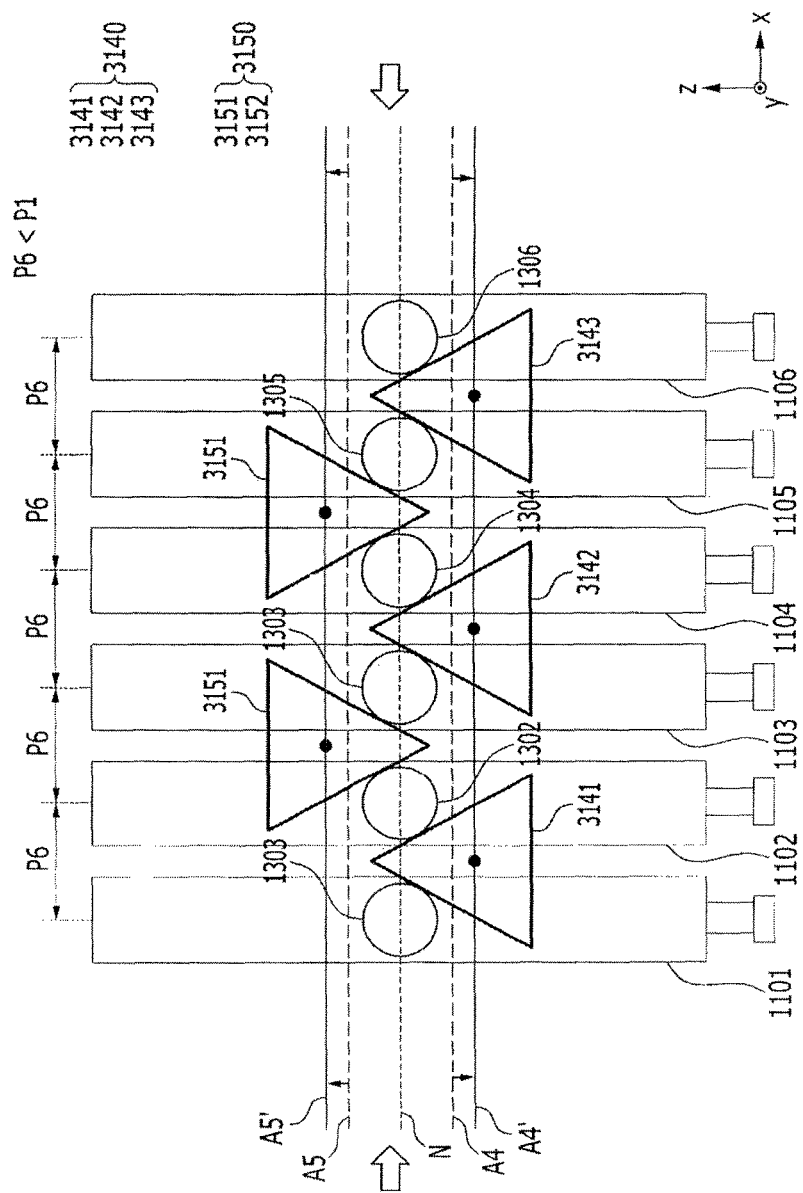

Referring to FIG. 17, the fourth guide rail A4 may move downward from the second direction (Z axis) and the fifth guide rail A5 may move upward along the second direction (Z axis). Thus, the first row of space adjusting plates 3140 installed in the fourth guide rail A4 may move downward along the second direction (Z axis) and the second row of space adjusting plates 3150 installed in the fifth guide rail A5 may move upward along the second direction (Z axis).

As the first row of space adjusting plates 3140 moves downward, the distance between the protruding portions 1301 and 1302, the distance between the protruding portions 1303 and 1304, and the distance between the protruding portions 1305 and 1306 may be decreased. As the second row of space adjusting plates 3150 moves upward, the distance between the protruding portions 1302 and 1303 and the distance between the protruding portions 1304 and 1305 may be decreased.

As the distance between the protruding portions 1301 and 1302, the distance between the protruding portions 1303 and 1304, and the distance between the protruding portions 1305 and 1306 are decreased, the distance between the picker bodies 1101 and 1102 and the distance between the picker bodies 1105 and 1106 may be decreased from pitch P1 to pitch P6.

As the distance between the between the protruding portions 1302 and 1303 and the distance between the protruding portions 1304 and 1305 are decreased, the distance between the picker bodies 1102 and 1103 and the distance between the picker bodies 1104 and 1105 may be decreased from pitch P1 to pitch P6.

Thus, the distances between the picker bodies 1101, 1102, 1103, 1104, 1105, and 1106 may be adjusted the same or different by the space adjusting part 3000 as illustrated in FIGS. 14 to 17.

Figure 18:
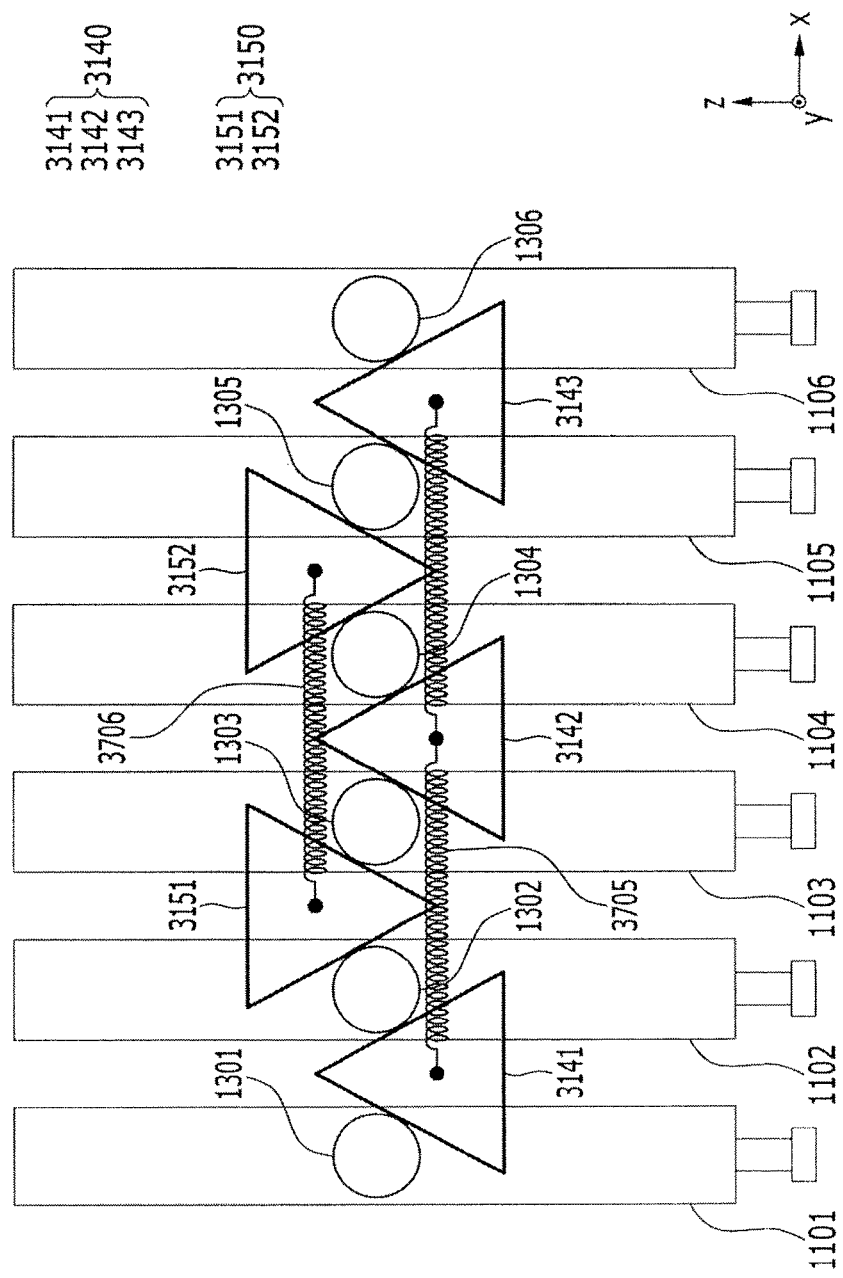
FIGS. 18 and 19 an embodiment of a pressurizing portion.

Referring to FIG. 18, springs 3705 may be combined between the first row of space adjusting plates 3140 adjacent to each other, to thereby stick the first row of space adjusting plates 3140, the second row of space adjusting plates 3150, and the protruding portions 1301, 1302, 1303, 1304, 1305, and 1306 to each other. For example, the spring 3705 may be connected between the first row of adjacent space adjusting plates 3141 and 3142, and the spring 3705 may be connected between the first row of adjacent space adjusting plates 3142 and 3143.

Additionally, spring 3706 may be combined between the second row of adjacent space adjusting plates 3150. For example, the spring 3706 may be connected between the second row of space adjusting plates 3151 and 3152.

Figure 19:
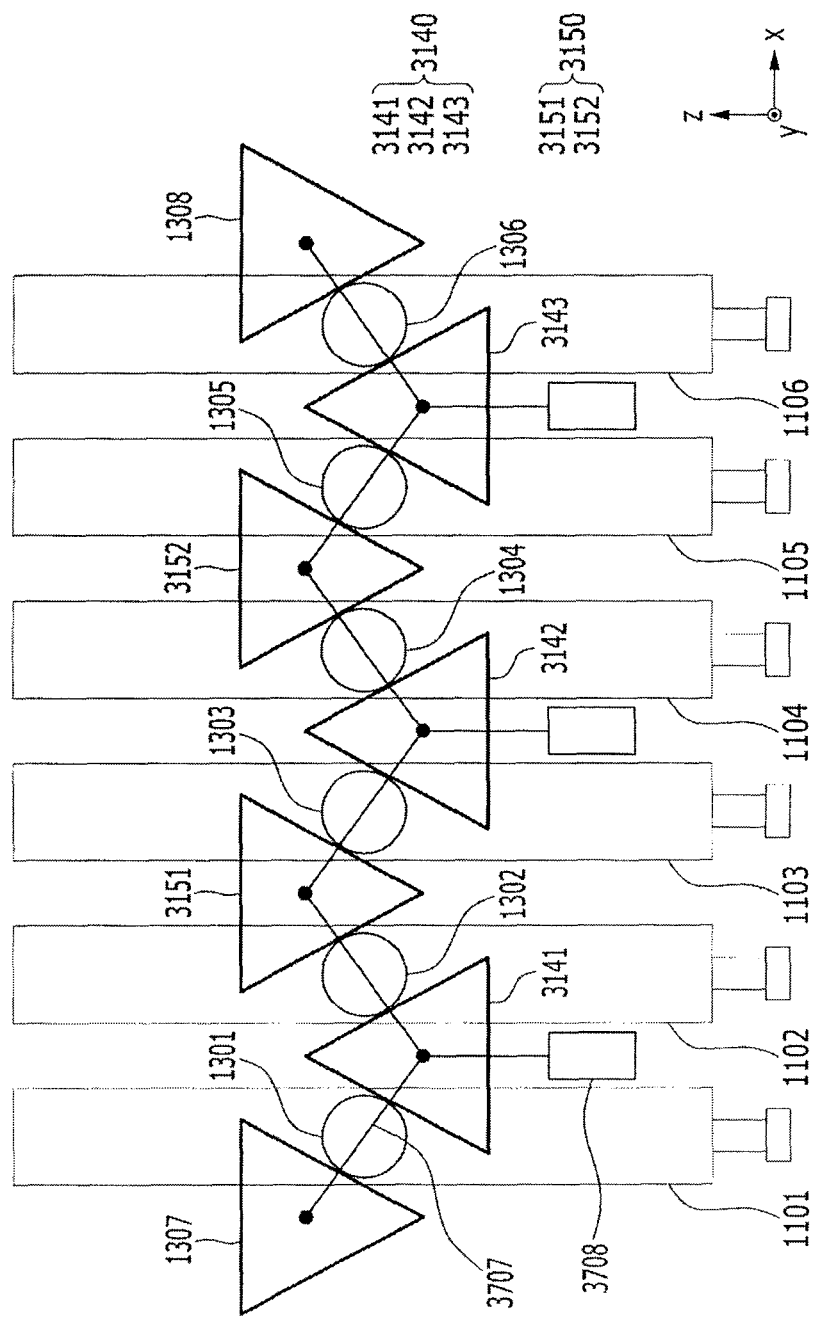

Referring to FIG. 19, wires may be connected between the first row of space adjusting plates 3140 and the second row of space adjusting plates 3150, to thereby stick the first row of space adjusting plates 3140, the second row of space adjusting plates 3150, and the protruding portions 1301, 1302, 1303, 1304, 1305, and 1306 to each other. In one embodiment, springs 3706 may be combined with the wires.

Figure 20:
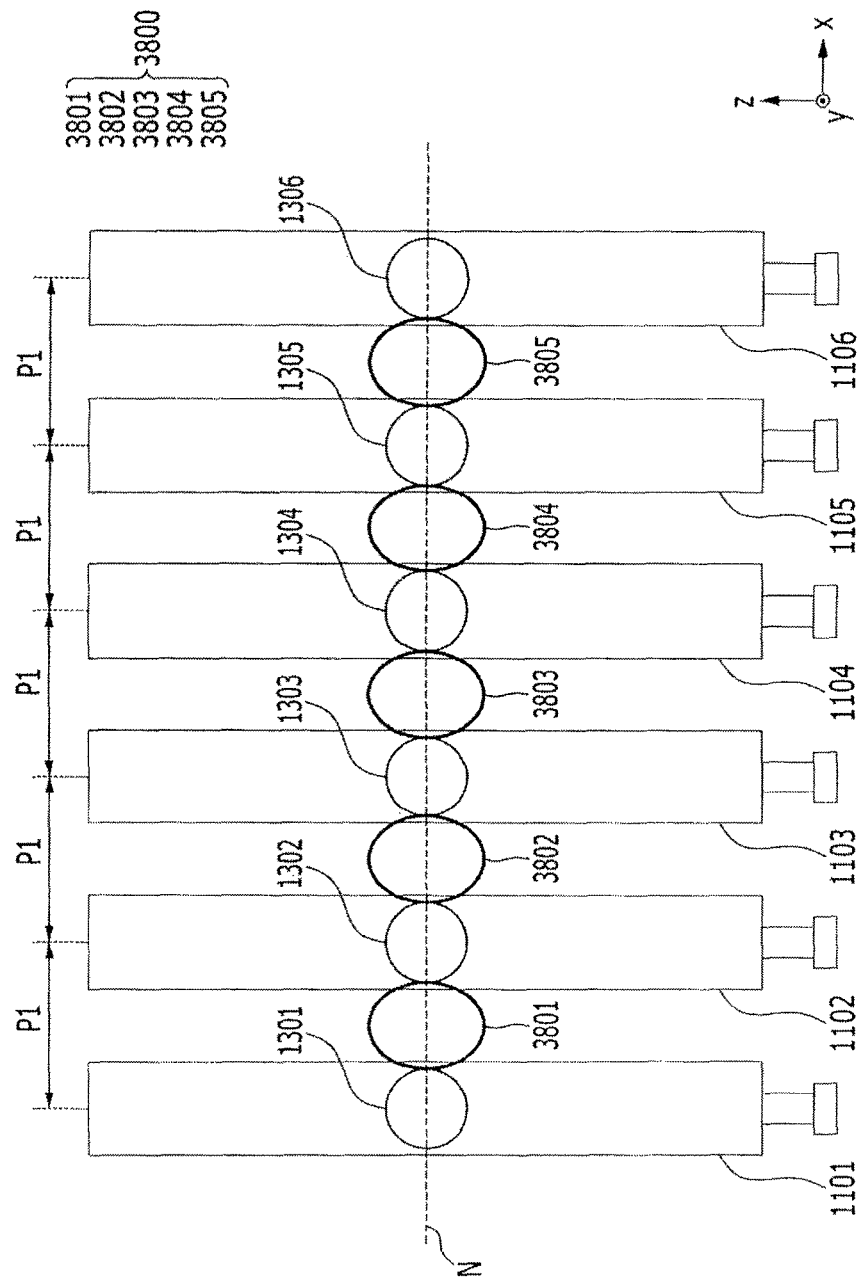
FIGS. 20 and 21 illustrate other embodiments of operations of the space adjusting part.
Figure 21:
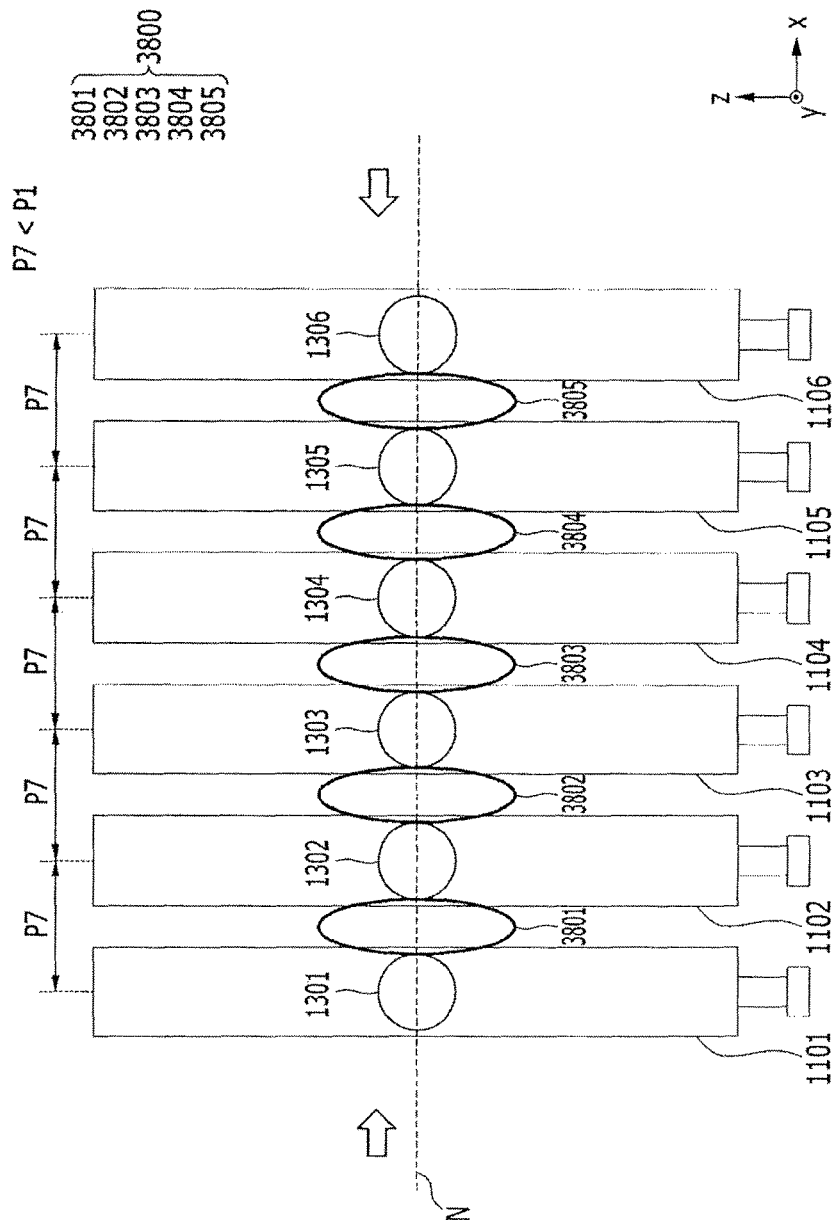

FIGS. 20 and 21 illustrate additional embodiments of operations of the space adjusting part in FIG. 9. Referring to FIG. 20, space adjusting plates 3801, 3802, 3803, 3804, and 3805 may have a tube shape. The widths of the space adjusting plates 3801, 3802, 3803, 3804, and 3805 in a first direction (X axis) may be changed by an external force. For example, the space adjusting plates 3801, 3802, 3803, 3804, and 3805 may include a metal tube having elasticity. For example, when no external force is exerted on the space adjusting plates 3801, 3802, 3803, 3804, and 3805, the space adjusting plates 3801, 3802, 3803, 3804, and 3805 may have a predetermined shape, e.g., an oval shape or circular shape as illustrated in FIG. 20.

The space adjusting plate 3801 may be between the adjacent protruding portions 1301 and 1302. The space adjusting plate 3802 may be between the adjacent protruding portions 1302 and 1303. The space adjusting plate 3803 may be between the adjacent protruding portions 1303 and 1304. The space adjusting plate 3804 may be between the adjacent protruding portions 1304 and 1305. The space adjusting plate 3805 may be between the adjacent protruding portions 1305 and 1306.

Referring to FIG. 21, as an external force is exerted on the protruding portions 1301 and 1306 in the first direction (X axis), the widths of the space adjusting plates 3801, 3802, 3803, 3804, and 3805 may be decreased. Thus, the distance between the protruding portions 1301 and 1302, the distance between the protruding portions 1302 and 1303, the distance between the protruding portions 1303 and 1304, the distance between the protruding portions 1304 and 1305, and the distance between the protruding portions 1305 and 1306 may be decreased.

Accordingly, the distance between the picker bodies 1101 and 1102, the distance between the picker bodies 1102 and 1103, the distance between the picker bodies 1103 and 1104, the distance between the picker bodies 1104 and 1105, and the distance between the picker bodies 1105 and 1106 may be decreased from pitch P1 to pitch P7.

Figure 22:
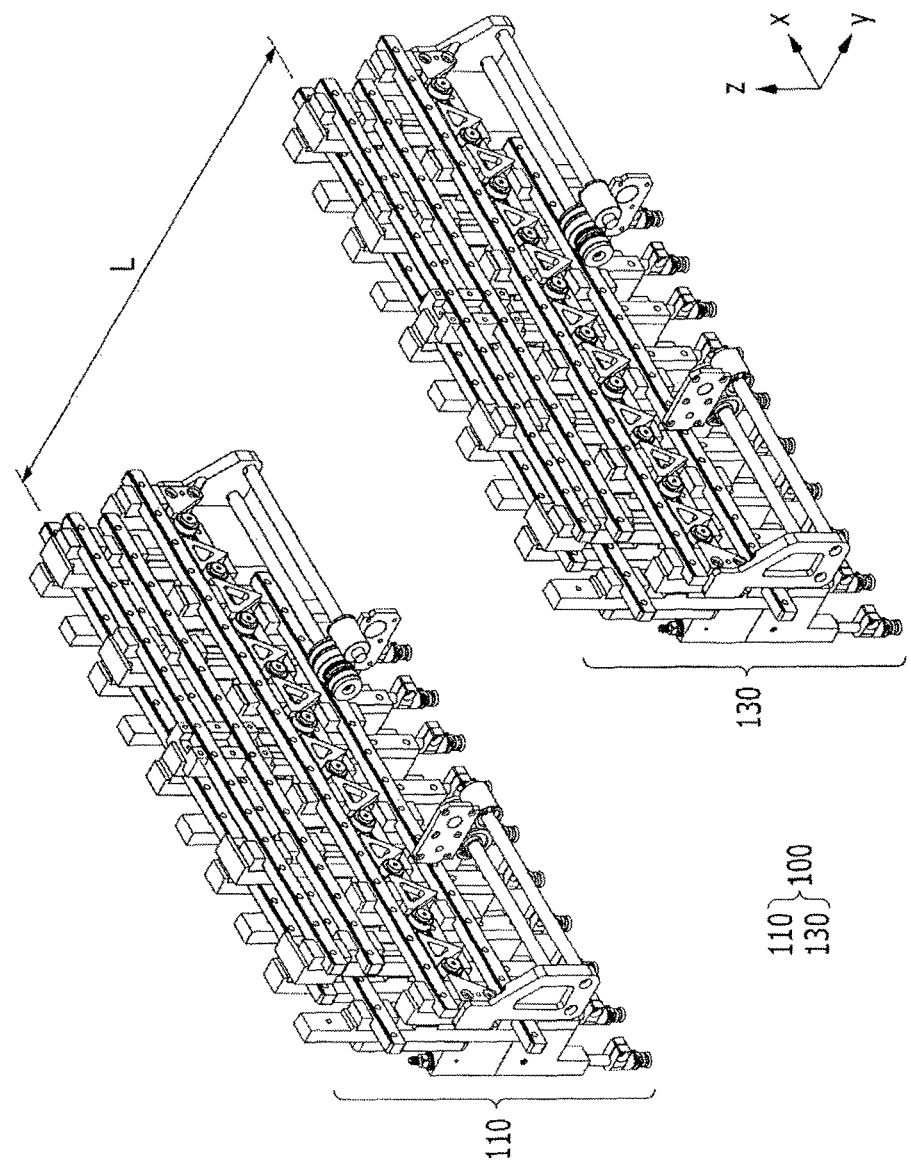
FIG. 22 illustrates another embodiment of a pickup unit.

Referring to FIG. 22, pickup unit 100 applied to pickup system 10 of a semiconductor device according to this embodiment may include a first row of pickup unit 110 and a second row of pickup unit 130. The first row of pickup unit 100 and the second row of pickup unit 130 may be spaced apart from each other along a third direction (Y axis). For example, a plurality of the pickup units 100 in FIG. 2 may be arranged in this embodiment. The distance L spaced between the first row of pickup unit 110 and the second row of pickup unit 130 in the third direction (Y axis) may be controlled.

In accordance with one or more of the aforementioned embodiments, a pickup system of a semiconductor device may automatically adjust distances between a plurality of pickers of a pickup unit corresponding to different distances between the semiconductor devices disposed in a first tray and a second tray T2.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A pickup apparatus, comprising:
a plurality of pickers to slide along a first direction, each of the plurality of pickers including a protruding portion combined with a picker body; and
a space adjuster including a plurality of space adjusting plates, each of the plurality of space adjusting plates between a respective pair of adjacent pickers of the plurality of pickers, the protruding portion of each of the plurality of pickers contacting sidewalls of adjacent ones of the plurality of space adjusting plates, wherein at least one of the plurality of space adjusting plates is to move along a second direction crossing the first direction and wherein a width in the first direction of each of the plurality of space adjusting plates varying along the second direction;
wherein the plurality of space adjusting plates includes:
a first row of space adjusting plates, a width of each of the space adjusting plates of the first row increasing from top to bottom along the second direction; and
a second row of space adjusting plates, each of the second row of space adjusting plates arranged between a respective pair of adjacent space adjusting plates in the first row, a width of each of the space adjusting plates of the second row decreasing from top to bottom along the second direction,
wherein the space adjuster includes:

a fourth guide rail including the first row of space adjusting plates; and
a fifth guide rail including the second row of space adjusting plates,
wherein the fifth guide rail is parallel with the fourth guide rail.

2. The pickup apparatus as claimed in claim 1, wherein the plurality of space adjusting plates are to slide along the first direction.

3. The pickup apparatus as claimed in claim 2, wherein the width of each of the plurality of space adjusting plates decreases along the second direction.

4. The pickup apparatus as claimed in claim 3, wherein each of the plurality of space adjusting plates has a symmetrical shape with respect to an axis parallel with the second direction.

5. The pickup apparatus as claimed in claim 4, wherein each of the plurality of space adjusting plates has a triangle, a trapezoid, a semicircle, or oval shape.

6. The pickup apparatus as claimed in claim 3, wherein the space adjuster includes:
a first guide rail including at least one of the plurality of space adjusting plates, and
a second guide rail including another one of the plurality of space adjusting plates.

7. The pickup apparatus as claimed in claim 6, wherein at least one of the first guide rail or the second guide rail is to move along the second direction.

8. The pickup apparatus as claimed in claim 3, wherein the space adjuster includes:
a third guide rail includes the plurality of space adjusting plates, wherein the third guide rail is to move along the second direction.

9. The pickup apparatus as claimed in claim 1, wherein at least one of the fourth guide rail and the fifth guide rail are to move along the second direction.

10. The pickup apparatus as claimed in claim 1, wherein the space adjuster includes:
a pressurizer to operatively engage a pair of space adjusting plates of the plurality of space adjusting plates, wherein the pressurizer is to pull the pair of space adjusting plates to each other.

11. The pickup apparatus as claimed in claim 10, wherein the pressurizer includes a spring.

12. The pickup apparatus as claimed in claim 1, wherein the space adjuster:
a pressurizer to operatively engage at least one of a pair of space adjusting plates at edge positions of the plurality of space adjusting plates in the first direction, wherein the pressurizer is to pressurize space adjusting plates toward a middle of the plurality of space adjusting plates.

13. The pickup apparatus as claimed in claim 12, wherein the pressurizer includes one of a hydraulic damper, an air damper, and a spring.

14. The pickup apparatus of claim 1, wherein the space adjuster includes:
a pressurizer to operatively engage at least one of a pair of pickers at edge positions of the plurality of pickers in the first direction, wherein the pressurizer is to pressurize pickers toward a middle of the plurality of pickers.

15. A pickup apparatus, comprising:
a plurality of pickers to slide along a first direction, each of the plurality of pickers including a protruding portion combined with a picker body; and
a space adjuster including a plurality of space adjusting plates, each of the plurality of space adjusting plates between a respective pair of adjacent pickers of the plurality of pickers, the protruding portion of each of the plurality of pickers contacting sidewalls of adjacent ones of the plurality of space adjusting plates, wherein a width in the first direction of each of the plurality of space adjusting plates is adjusted by the protruding portions on sidewalls of respective ones of the space adjusting plates;
wherein the plurality of space adjusting plates includes:
a first row of space adjusting plates, a width of each of the space adjusting plates of the first row increasing from top to bottom along the second direction; and
a second row of space adjusting plates, each of the second row of space adjusting plates arranged between a respective pair of adjacent space adjusting plates in the first row, a width of each of the space adjusting plates of the second row decreasing from top to bottom along the second direction,
wherein the space adjuster includes:
a fourth guide rail including the first row of space adjusting plates; and
a fifth guide rail including the second row of space adjusting plates,
wherein the fifth guide rail is parallel with the fourth guide rail,
wherein at least one of the plurality of space adjusting plates is to move along a second direction crossing the first direction and
wherein a width in the first direction of each of the plurality of space adjusting plates varying along the second direction.

16. The pickup apparatus as claimed in claim 15, wherein each of the plurality of space adjusting plates includes an elastic material.

17. The pickup apparatus as claimed in claim 15, wherein each of the plurality of space adjusting plates has a tube shape.

18. A pickup system of a semiconductor device, comprising:
a first tray including a plurality of semiconductor devices spaced apart from each other by a first distance;
a second tray including a plurality of semiconductor devices spaced apart from each other by a second distance different from the first distance; and
a pickup to transfer the semiconductor device to the first tray or the second tray, the pickup including:
a plurality of pickers to slide along a first direction, each of the plurality of pickers including a protruding portion combined with a picker body; and
a space adjuster including a plurality of space adjusting plates, each of the plurality of space adjusting plates between a respective pair of adjacent pickers of the plurality of pickers, the protruding portion of each of the plurality of pickers contacting sidewalls of adjacent ones of the plurality of space adjusting plates, wherein at least one of the plurality of space adjusting plates is to move along a second direction crossing the first direction, and wherein widths in the first direction of the plurality of space adjusting plates vary along the second direction;
wherein the plurality of space adjusting plates includes:
a first row of space adjusting plates, a width of each of the space adjusting plates of the first row increasing from top to bottom along the second direction; and
a second row of space adjusting plates, each of the second row of space adjusting plates arranged between a respective pair of adjacent space adjusting plates in the first row, a width of each of the space adjusting plates of the second row decreasing from top to bottom along the second direction,
wherein the space adjuster includes:
- a fourth guide rail including the first row of space adjusting plates; and
- a fifth guide rail including the second row of space adjusting plates, wherein the fifth guide rail is parallel with the fourth guide rail.

* * * * *